United States Patent
Maezawa et al.

(10) Patent No.: US 7,609,187 B2
(45) Date of Patent: Oct. 27, 2009

(54) ΔΣ MODULATOR AND ΔΣ ANALOG-DIGITAL CONVERTER

(75) Inventors: Koichi Maezawa, Nagoya (JP); Takashi Mizutani, Nagoya (JP)

(73) Assignee: National University Corporation Nagoya University, Nagoya-shi (JP)

( * ) Notice: Subject to any disclaimer, the term of this patent is extended or adjusted under 35 U.S.C. 154(b) by 0 days.

(21) Appl. No.: 11/883,886

(22) PCT Filed: Feb. 10, 2006

(86) PCT No.: PCT/JP2006/302334

§ 371 (c)(1),
(2), (4) Date: Aug. 8, 2007

(87) PCT Pub. No.: WO2006/085605

PCT Pub. Date: Aug. 17, 2006

(65) Prior Publication Data

US 2008/0258952 A1   Oct. 23, 2008

(30) Foreign Application Priority Data

Feb. 10, 2005   (JP)   ............................. 2005-035196

(51) Int. Cl.
  *H03M 3/00*   (2006.01)
(52) U.S. Cl. ...................... 341/143; 341/155
(58) Field of Classification Search .............. 341/155, 341/143, 144, 120; 375/316, 319; 331/175
See application file for complete search history.

(56) References Cited

U.S. PATENT DOCUMENTS 5,012,244 A * 4/1991 Wellard et al. .............. 341/143

(Continued)

FOREIGN PATENT DOCUMENTS

| JP | A 4-346521 | 12/1992 |
|---|---|---|
| JP | A 6-204880 | 7/1994 |
| JP | A 6-318872 | 11/1994 |
| JP | A 11-41171 | 2/1999 |
| JP | A 2002-261615 | 9/2002 |
| JP | A 2003-87111 | 3/2003 |

OTHER PUBLICATIONS

Maezawa, K., et al. "A Novel Resonant Tunneling Delta-Sigma AD Converter Suitable for High Frequency Operation," *The Institute of Electronics, Information and Communication Engineers*, pp. 1-6 (2006).

(Continued)

*Primary Examiner*—Peguy JeanPierre
(74) *Attorney, Agent, or Firm*—Oliff & Berridge, PLC

(57) ABSTRACT

The present invention provides a ΔΣ modulator of a frequency modulation system that can lessen the requirement of linearity for an oscillator.

A ΔΣ modulator comprises an oscillating apparatus that changes a frequency thereof according to an input signal, a quantizing means for quantizing a frequency modulation signal output from the oscillating apparatus, and an operation means for applying an operation to a digital signal output from the quantizing means. The oscillating apparatus comprises an oscillator that changes a frequency thereof according to the input signal, a reference signal source that outputs a reference signal at a predetermined frequency, a mixer that receives the signals from the oscillator and the reference signal source, and a low-pass filter that passes a low frequency component of a signal output from the mixer. The center oscillation frequency of the oscillator is set higher than a target center oscillation frequency of the frequency modulation signal.

34 Claims, 22 Drawing Sheets

U.S. PATENT DOCUMENTS

| | | | | |
|---|---|---|---|---|
| 5,619,536 | A * | 4/1997 | Gourgue | 375/316 |
| 5,858,388 | A * | 1/1999 | Grossman et al. | 424/423 |
| 6,388,597 | B1 | 5/2002 | Maezawa et al. | |
| 6,765,520 | B1 * | 7/2004 | Chuang et al. | 341/143 |
| 6,795,002 | B2 * | 9/2004 | Gupta | 341/143 |
| 6,920,182 | B2 * | 7/2005 | Bolton, Jr. | 375/247 |
| 6,954,628 | B2 * | 10/2005 | Minnis et al. | 455/324 |
| 7,525,465 | B1 * | 4/2009 | Elwan et al. | 341/143 |
| 2007/0019758 | A1 * | 1/2007 | Haque et al. | 375/316 |
| 2008/0240294 | A1 * | 10/2008 | Hall | 375/319 |

OTHER PUBLICATIONS

Maezawa, K., et al. "A Novel Resonant Tunneling Delta-Sigma A/D Converter for Ultrahigh-Speed Operation," *The Institute of Electronics, Information and Communication Engineers*, Sougo Taikai, p. 48 (2005).

Høvin, M., et al. "Delta-Sigma Modulators Using Frequency-Modulated Intermediate Values," *IEEE Journal of Solid-State Circuits*, vol. 32, No. 1, pp. 13-22 (1997).

Sako, M., et al. "A $\Delta\Sigma$ADC Using Resonant Tunneling Diodes and MOSFET," *IEICE Electronics Society*, p. 50 (2004).

* cited by examiner

US 7,609,187 B2

ΔΣ MODULATOR AND ΔΣ ANALOG-DIGITAL CONVERTER

TECHNICAL FIELD

The present application claims priority based on Japanese Patent Application No. 2005-35196 filed on Feb. 10, 2005. The entire contents of the application are incorporated herein by reference.

The present invention relates to a ΔΣ analog-digital converter of the ΔΣ modulation type. More particularly, the present invention relates to improvements of a ΔΣ modulator employed by a ΔΣ analog-digital converter.

BACKGROUND ART

A ΔΣ analog-digital converter is known as a converter which can convert an analog signal into a digital signal. FIG. 30 is a block diagram showing a basic configuration of the ΔΣ analog-digital converter. The ΔΣ analog-digital converter includes a ΔΣ modulator 116, and a digital filter 118 connected to the ΔΣ modulator 116.

The ΔΣ modulator 116 samples an input analog signal at a predetermined sampling frequency (a frequency higher than the Nyquist frequency) to convert the analog signal into a pulse density signal. The digital filter 118 removes the high frequency components from the pulse density signal converted by the ΔΣ modulator 116, thereby converting the pulse density signal into a multi-bit digital signal. Thus, in order to achieve sufficient conversion accuracy for the ΔΣ analog-digital converter, it is necessary to set the sampling frequency of the ΔΣ modulator 116 to a very high frequency compared with the target signal frequency.

FIG. 29 shows a configuration of a ΔΣ modulator that has a feedback system which is conventionally used. The ΔΣ modulator includes an integrator 110, a quantizer 112, a digital-analog converter 114, and an adder 108.

The integrator 110 integrates the analog signal output from the adder 108. The quantizer 112 quantizes a signal output from the integrator 110 at a predetermined sampling frequency. Specifically, the quantizer 112 determines whether a signal output from the integrator 110 exceeds a predetermined threshold at every sampling period, and outputs a signal when the signal exceeds the predetermined threshold. The output of the quantizer 112 is output to the digital filter, and is fed back via the digital-analog converter 114. The digital-analog converter 114 converts the output from the quantizer 112 into an analog signal. The adder 108 inverts the polarity of the analog signal converted by the digital-analog converter 114, and adds the inverted analog signal to the analog signal input from an input terminal. Thus, according to the above ΔΣ modulator, the deviation between the input signal input from the input terminal and the output signal is integrated, and the output is controlled so as to minimize the deviation. As a result, an output signal output from the ΔΣ modulator is a pulse density signal according to the input analog signal.

As already described, in order to achieve sufficient conversion accuracy for the ΔΣ analog-digital converter, it is necessary to set the sampling frequency of the ΔΣ modulator 116 to a very high frequency compared with a target signal frequency. However, for a ΔΣ modulator employing a feedback system, the feedback of the output signal restricts the operation speed (sampling period) of the quantizer 112. Therefore, an analog-digital converter employing a ΔΣ modulator that has a feedback system can be used only for relatively low frequency input signals.

Therefore, a ΔΣ modulator of frequency modulation system which does not feed back the output signal (Mats Hovin and Alf Olsen, "Delta-Sigma Modulators Using Frequency-Modulated Intermediate Values", IEEE Journal of Solid-State Circuits, vol. 32, pp. 13-22, 1997) has been proposed.

FIG. 28 shows a configuration of the ΔΣ modulator of a frequency modulation system. This ΔΣ modulator is constituted by a voltage-controlled oscillator 100, a quantizer 102, a register 104, and an EX-OR circuit 106. The voltage-controlled oscillator 100 modulates an input analog signal into a signal at a frequency according to the input analog signal amplitude (frequency modulation signal). The quantizer 102 identifies the frequency modulation signal output from the voltage-controlled oscillator 100 as a binary value at a sampling frequency of fs. In other words, the quantizer 102 identifies the frequency modulation signal as "+" or "−" at the sampling frequency fs, and outputs "1" if the frequency modulation signal is "+", and "0" if the frequency modulation signal is "−". As a result, the output of the quantizer 102 changes from "0" to "−", and "1" to "0" according to the input frequency modulation signal. The register 104 stores the signal output from the quantizer 102 at the sampling period fs. The EX-OR circuit 106 thus receives the present output of the quantizer 102 and the output of the quantizer 102 from the previous period that was stored in the register 104. As a result, the EX-OR circuit 106 outputs a signal of only one pulse if the output of the quantizer 102 changes from "1" to "0", and if the output of the quantizer 102 changes from "0" to "1". As a result, an output signal output from the ΔΣ modulator is the pulse density signal according to the input analog signal.

It should be noted that the phase of the frequency modulation signal output from the voltage-controlled oscillator 100 is an integral of the phase of the input analog signal. Since the phase becomes 0 after an advance of 2, the output is reset to 0 without the feedback of the output signal. It is thus not necessary for the ΔΣ modulator of a frequency modulation system to feed back the output signal, which is necessary for the ΔΣ modulator of a feedback system, thereby providing the advantage of being suitable for high-speed operation.

DISCLOSURE OF THE INVENTION

The ΔΣ modulator of a frequency modulation system converts the input analog signal to the frequency modulation signal by means of the oscillator, and then converts the converted frequency modulation signal into the pulse density signal. As a result, in order to precisely convert the input signal into the pulse density signal, it is necessary for the oscillator to bear linearity in a wide frequency modulation range of the input signal. However, it is difficult to maintain the linearity in the wide frequency modulation range, and the ΔΣ modulator of a frequency modulation system has not yet been put into practical use.

It is an object of the present invention to provide a technology which can narrow the frequency range where the linearity is required for the oscillator of the ΔΣ modulator of frequency modulation system.

A ΔΣ modulator according to a first aspect of the present invention includes an oscillating means that changes a frequency thereof according to an input signal, a quantizing means that quantizes a frequency modulation signal output from the oscillating means, and an operation means that applies an operation to a digital signal output from the quantizing means (such as a logical operation circuit constituted by a register and an EX-OR circuit). The oscillating means of this ΔΣ modulator includes an oscillator that changes a frequency thereof according to the input signal, a reference signal source that outputs a reference signal at a predetermined frequency, a mixer that receives the signals from the oscillator and the reference signal source, and a low-pass filter that passes low frequency components of a signal output from the mixer. A center oscillation frequency of the oscillator is set higher than a target center oscillation frequency of the frequency modulation signal.

This ΔΣ modulator includes two signal sources, which are the oscillator and the reference signal source; and the center oscillation frequency of the oscillator is set higher than the target center oscillation frequency of the frequency modulation signal. As a result, the oscillator applies the frequency modulation at the frequency higher than the target frequency range of the frequency modulation signal, and mixes this frequency modulation signal with the reference signal to produce the frequency modulation signal in the target frequency range. As the center oscillation frequency of the oscillator increases, the frequency modulation range corresponding to the center oscillation frequency narrows. Consequently, the range where the linearity is required for the input signal narrows, and the requirement of linearity for the oscillator is lessened. Since the frequency modulation signal after the mixing passes the low-pass filter, high frequency components (noise) thereof are removed. Even if the center oscillation frequency of the oscillator is set high, a problem such as high frequency noises will not occur.

Moreover, a ΔΣ modulator according to a second aspect of the present invention includes an oscillating means that changes a frequency thereof according to an input signal, a quantizing means that quantizes a frequency modulation signal output from the oscillating means, and an operation means that applies an operation to a digital signal output from the quantizing means (such as an operation circuit constituted by a register and an EX-OR circuit). The oscillating means of this ΔΣ modulator includes a first oscillator that changes a frequency thereof according to the input signal, a second oscillator that changes a frequency thereof according to the input signal, a mixer that receives the signals from the two oscillators, and a low-pass filter that passes low frequency components of a signal output from the mixer. Either the first oscillator or the second oscillator has a positive frequency dependency to the input signal, and the other one has a negative frequency dependency to the input signal, and the center oscillation frequencies of the two oscillators are set higher than a target center oscillation frequency of the frequency modulation signal.

Also in this ΔΣ modulator, the center oscillation frequencies of the two oscillators constituting the oscillating means are set higher than the target center oscillation frequency of the frequency modulation signal, and the target frequency modulation signal is produced by mixing the signals from these two oscillators. Therefore, as the first ΔΣ modulator, it is possible to lessen the requirement for the linearity of the oscillators.

Moreover, in the second ΔΣ modulator, one of the two oscillators has a positive frequency dependency, and the other has a negative frequency dependency. As a result, if the signals output from both of the oscillators (f1±Δf1, f2±Δf2) are mixed, the center oscillation frequency of the mixed signal is obtained by subtraction: (f1−f2), and the frequency modulation range is obtained by addition: [±(Δf1+Δf2)], which widens the range. Thus, the respective oscillators may carry out the frequency modulation in a frequency modulation range narrower than the target frequency modulation range of the frequency modulation signal, and it is thus possible to further lessen the requirement of linearity required for the oscillators. Moreover, since the same input signal is used as the control signal for the oscillators, it is possible to cancel out noises acting in the same manner on both the oscillators (such as noises due to a power supply).

Both the first oscillator and the second oscillator may be voltage-controlled oscillators. An analog signal for control which is input to one voltage-controlled oscillator is preferably a complementary signal of an analog signal for control which is input to the other voltage-controlled oscillator.

With this configuration, it is possible to impart a positive frequency dependency to the one voltage-controlled oscillator, and to impart a negative frequency dependency to the other voltage-controlled oscillator with the simple configuration.

Moreover, according to the second ΔΣ modulator of the present invention, the signal output from the first oscillator and the signal output from the second oscillator are added to each other by the mixer, and the signal obtained as a result of the addition by the mixer is quantized by the quantizing means. However, this configuration may be modified into a ΔΣ modulator as described below.

In other words, another ΔΣ modulator of the present invention includes a first oscillating means that changes a frequency thereof according to an input signal, a second oscillating means that changes a frequency thereof according to the input signal, a first quantizing means that quantizes a frequency modulation signal output from the first oscillating means, a second quantizing means that quantizes a frequency modulation signal output from the first oscillating means, and a digital signal processing means (such as a processor) that processes digital signals output respectively from the first and second quantizing means. One of the first oscillating means and the second oscillating means has a positive frequency dependency to the input signal, and the other one has a negative frequency dependency to the input signal.

In this ΔΣ modulator, the digital signal processing means applies a predetermined operation (operation carried out by a register and an EX-OR circuit) to the digital signal output from the first quantizing means and the digital signal output from the second quantizing means, and then carries out a subtraction. As a result, the input analog signal is converted into a multi-value pulse density signal.

Also in this ΔΣ modulator, either the first oscillating means or the second oscillating means has a positive frequency dependency, and the other has a negative frequency dependency. It is therefore possible, by adding the digital signals output from both the oscillating means, to remove noises common to the first oscillating means and the second oscillating means (noises caused by a power supply and a circuit board), and even-order non-linear components.

It is possible, by setting the center oscillation frequencies of the first oscillating means and the second oscillating means higher than a target center oscillation frequency of the frequency modulation signal, to lessen the requirement of linearity required for both oscillating means.

For the ΔΣ modulator of a feedback system, a higher-order ΔΣ modulator is generally constituted by increasing the number of integrators and feedbacks. By constituting a high-order ΔΣ modulator, it is possible to move quantization noise to a higher frequency area, thereby increasing the S/N ratio. Therefore, there is a demand for constituting a high-order ΔΣ modulator using a ΔΣ modulator of a frequency modulation system.

Though it is possible to constitute a high-order ΔΣ modulator by employing integrators and feedbacks for a ΔΣ modulator of a frequency modulation system, it is not desirable to employ the feedbacks in terms of high-speed operation. As a method for constituting a higher-order ΔΣ modulator without employing the feedbacks, one or more integrators may be provided on an input side, and one or more differential operation circuits are provided on an output side in the ΔΣ modulator of frequency modulation system. However, with this configuration, the output signal is not fed back, and the subtraction from the output of the integrator(s) provided on the input side is not carried out, and thus a problem of integrator saturation is posed. In particular, low frequency signal components contained in the input signal easily saturate the output of the integrators. Another object of the present invention is to provide a technology which can increase the order of a ΔΣ modulator of a frequency modulation system without sacrificing high-speed operation.

A ΔΣ modulator according to a third aspect of the present invention includes a band-pass filter, integrating means (integrator) that integrates an input signal which has passed the band-pass filter, oscillating means (oscillator) which changes a frequency thereof according to a signal output from the integrating means, quantizing means that quantizes a frequency modulation signal output from the oscillating means, a first differentiating means (differential circuit) which differentiates a digital signal output from the quantizing means, and second differentiating means (differential circuit) which differentiates a digital signal output from the first differentiating means.

In this ΔΣ modulator, an input analog signal is converted into an analog signal within a narrow frequency band by the band-pass filter, and is input to the integrating means. As a result, the integrating means saturation problem is lessened. If the band-pass filter is to remove low-frequency components of the input analog signal, the problem of the saturation of the integrating means is lessened further, which is more preferable.

An even higher-order ΔΣ modulator may be constituted by providing multiple integrating means on the input side of the oscillating means, and differentiating means whose number corresponds to the number of the integrating means on the output side on the quantizing means.

Moreover, a fourth ΔΣ modulator according to the present invention includes an integrating means (integrator) that integrates an analog input signal, an oscillating means (oscillator) that changes a frequency thereof according to an output signal from the integrating means, a quantizing means that quantizes a frequency modulation signal output from the oscillating means, an operation means (such as an operation circuit constituted by a register and an EX-OR circuit) that applies an operation to a digital signal output from the quantizing means, a detecting means that detects that the output signal from the integrating means reaches a predetermined value, a resetting means that resets the integrating means based on a detection signal from the detecting means, and a digital signal processing means (such as a processor) that applies a predetermined operation to a digital signal output from the operation means based on the detection signal output from the detecting means.

In this ΔΣ modulator, the input analog signal is input to the oscillating means via the integrating means, and is converted into the frequency modulation signal by the oscillating means. The frequency modulation signal output from the oscillating means is converted by the quantizing means and the operation means into a pulse density signal. In this configuration, since the output from the integrating means is reset each time the output from the integrating means reaches the predetermined value, the output signal of the integrating means is displaced from a signal to be output by a value corresponding to the reset number. The digital signal processing means thus corrects the pulse density signal output from the operation means based on the detection signal (reset number of the integrating means) output from the detecting means. As a result, it is possible to prevent the integrating means from being saturated, and also to constitute a high-order ΔΣ modulator.

An even higher-order ΔΣ modulator may be constituted by providing multiple integrators on the input side of the oscillator, and providing detecting circuits and the resetting means for the respective integrators. Moreover, a first-order ΔΣ modulator connected to the output side of the integrator may not be limited to a ΔΣ modulator of a frequency modulation system, and may be a ΔΣ modulator of a feedback system.

Moreover, the technology which resets the integrator when the output of the integrator reaches a predetermined value may be applied to a first-order ΔΣ modulator. For example, a ΔΣ modulator according to one aspect of the present invention includes an integrating means (integrator) that integrates an analog input signal, a quantizing means (quantizer) that quantizes an output signal from the integrating means, and an operation means (such as an operation circuit constituted by a register and an EX-OR circuit) that applies an operation to a digital signal output from the quantizing means. The ΔΣ modulator further includes a detecting means that detects that the output signal from the integrating means reaches a predetermined value, a resetting means that resets the integrating means based on a detection signal from the detecting means, and a digital signal processing means (such as a processor) that applies a predetermined operation to a digital signal output from the operation means based on the detection signal output from the detecting means.

In this ΔΣ modulator, it is preferable that the quantizing means includes multiple quantizers connected in parallel, and the respective quantizers are driven by clock signals different in phase.

With this configuration, the respective quantizers output quantized signals different in phases (timing). As a result, the quantizing means operates at a frequency higher than the sampling frequency of the respective quantizers, thereby increasing the speed of the quantizing means.

Alternatively, the quantizing means may include multiple quantizers, and frequency modulation signals different in phase may be input to the respective quantizers.

With this configuration, though the respective quantizers sample the frequency modulation signal in the same timing, the frequency modulation signals to be sampled are different in phase. Also in this case, the same effect as described above is provided.

In the above respective ΔΣ modulators, the quantizing means may include a first negative differential resistance element which bears an N-type negative differential resistance, and a second negative differential resistance element which bears an N-type negative differential resistance. The second negative differential resistance element is serially connected to the first negative differential resistance element. An oscillating voltage is impressed between terminals of the two negative differential resistance elements.

With this configuration, by adjusting the oscillating voltage impressed between the terminals of the two negative differential resistance elements, it is possible to cause the ΔΣ modulator to transition from a mono-stable state to a bi-stable state according to the oscillating voltage. In the bi-stable state, there are two stable points according to peak currents of the negative differential resistance elements. Therefore, by changing the peak current of the one of the negative differential resistance elements according to the input voltage, it is possible to switch the output thereof between two states (namely, to quantize). The N-type negative differential resistance elements operate at a high speed, and a quantizer employing it can thus operate at a high speed.

When the above configuration is employed, it is preferable that the quantizing means further comprises a transistor, and the analog input signal is input to an input terminal of the transistor. An output terminal of the transistor is connected to a connection point between the first negative differential resistance element and the second negative differential resistance element.

With this configuration, the transistor is turned on and off according to the analog input signal, and the peak current of one of the negative differential resistance elements is changed according to the on and off status of the transistor. As a result, the voltage level of the output signal can be switched, thereby identifying the frequency modulation signal as a binary value.

Moreover, it is preferable that the input signal is input to a connection point between the first negative differential resistance element and the second negative differential resistance element via an impedance element, an oscillating voltage including a predetermined DC bias voltage is impressed on either one of two outer terminals of the first negative differential resistance element or the second negative differential resistance element, and an oscillating voltage having opposite polarity along with the predetermined DC bias voltage is impressed on the other one of the two outer terminals.

With this configuration, the circuit is symmetrical with respect to the positive and negative oscillating voltages, resulting in a stable high-speed operation. It should be noted that the "predetermined DC bias voltage" includes 0V. Thus, an oscillating voltage fluctuating toward both the positive and negative sides with 0V as the center may be impressed.

Moreover, in the above respective $\Delta\Sigma$ modulators, a limiter amplifier is preferably provided on an input side of the quantizing means.

With this configuration, the frequency modulation signal output from the oscillator has a waveform similar to a square wave, and then the signal is input to the quantizing means. As a result, the identification by the quantizing means becomes easier, and the requirement for the sensitivity of the quantizing means is lessened.

The limiter amplifier may include an N-type negative differential resistance element and an impedance element, for example.

Moreover the present invention provides a novel MASH type $\Delta\Sigma$ modulator. In other words, a fifth $\Delta\Sigma$ modulator according to the present invention includes a first $\Delta\Sigma$ modulator including integrating means (integrator) that integrates an analog input signal, quantizing means (quantizer) that quantizes an output signal from the integrating means, and first adding means (first adder) that inverts the polarity of an output signal from the quantizing means, and adds the inverted output signal to the analog input signal, second adding means (second adder) that inverts the polarity of either the output signal from the quantizing means of the first $\Delta\Sigma$ modulator or the output signal from the integrating means of the first $\Delta\Sigma$ modulator, and adds the inverted signal to the other one of the signals, a second $\Delta\Sigma$ modulator that receives a signal from the second adding means, differentiating means (differential circuit) that differentiates a digital signal from the second $\Delta\Sigma$ modulator, and operation means (such as a processor) that applies an operation to a digital signal output from the differentiating means and the digital signal output from the quantizing means of the first $\Delta\Sigma$ modulator. A sampling frequency of the second $\Delta\Sigma$ modulator is higher than a sampling frequency of the first $\Delta\Sigma$ modulator.

In this $\Delta\Sigma$ modulator, since the conversion accuracy is determined by the sampling frequency of the second $\Delta\Sigma$ modulator, the conversion accuracy is secured by setting the sampling frequency of the second $\Delta\Sigma$ modulator higher than the sampling frequency of the first $\Delta\Sigma$ modulator. Moreover, since the sampling frequency of the first $\Delta\Sigma$ modulator can be set low, the first $\Delta\Sigma$ modulator can be constituted by a $\Delta\Sigma$ modulator of a feedback system. As a result, a problem will not be posed by the integrating means of the first $\Delta\Sigma$ modulator saturating.

In order to set the sampling frequency of the second $\Delta\Sigma$ modulator high in the above configuration, the aforementioned $\Delta\Sigma$ modulator of a frequency modulation system is preferably employed.

Moreover, after inverting the polarity, the output signal from the integrating means of the first $\Delta\Sigma$ modulator or the output signal from the quantizing means of the first $\Delta\Sigma$, modulator may be input to the adding means that adds the signal output from the quantizing means of the first $\Delta\Sigma$ modulator and the output signal from the integrating means of the first $\Delta\Sigma$ modulator to each other.

On this occasion, the "first $\Delta\Sigma$ modulator" may be constituted by a high-order $\Delta\Sigma$ modulator (feedback system) by increasing the number of the integrating means (integrators) and the feedbacks. Moreover, first-order $\Delta\Sigma$ modulators, which are constituted by the integrating means, the quantizing means, and the adding means, may be connected into multiple stages.

Moreover, in the above MASH type $\Delta\Sigma$ modulator, the differentiating means (differential circuit) that differentiates the digital signal from the second $\Delta\Sigma$ modulator may be omitted, and the output signal from the second $\Delta\Sigma$ modulator may be directly input to the operation means (processor). In other words, a MASH type $\Delta\Sigma$ modulator according to the present invention includes a first $\Delta\Sigma$ modulator including an integrating means (integrator) that integrates an analog input signal, quantizing means (quantizer) that quantizes an output signal from the integrating means, a first adding means (first adder) that inverts the polarity of an output signal from the quantizing means and adds the inverted output signal to the analog input signal, a second adding means (second adder) that inverts the polarity of either the output signal from the quantizing means of the first $\Delta\Sigma$ modulator or the output signal from the integrating means of the first $\Delta\Sigma$ modulator and adds the inverted signal to the other one of the signals, a second $\Delta\Sigma$ modulator that receives a signal from the second adding means, and an operation means (such as a processor) that applies an operation to a digital signal output from the second $\Delta\Sigma$ modulator and the digital signal output from the quantizing means of the first $\Delta\Sigma$ modulator. A sampling frequency of the second $\Delta\Sigma$ modulator is higher than a sampling frequency of the first $\Delta\Sigma$ modulator. In this $\Delta\Sigma$ modulator, the operation means differentiates the digital signal output from the second $\Delta\Sigma$ modulator, and the predetermined operation is applied to the differentiated digital signal and the digital signal output from the quantizing means of the first $\Delta\Sigma$ modulator. This configuration can also provide the functions as the above $\Delta\Sigma$ modulator.

Moreover, the second $\Delta\Sigma$ modulator of this MASH type $\Delta\Sigma$ modulator may be replaced by an oscillating means (oscillator) and quantizing means (quantizer). In other words, a MASH type $\Delta\Sigma$ modulator according to the present invention includes a first $\Delta\Sigma$ modulator including an integrating means (integrator) that integrates an analog input signal, a first quantizing means (first quantizer) that quantizes an output signal from the integrating means, and a first adding means (first adder) that inverts the polarity of an output signal from the first quantizing means and adds the inverted output signal to the analog input signal, a second adding means (second adder) that inverts the polarity of either the output signal from the first quantizing means of the first ΔΣ modulator or the output signal from the integrating means of the first ΔΣ modulator and adds the inverted signal to the other one of the signals, an oscillating means (oscillator) that changes a frequency thereof according to a signal from the second adding means, a second quantizing means (second quantizer) that quantizes an output signal from the oscillating means, and an operation means (such as a processor) that applies an operation to a digital signal output from the second quantizing means and the digital signal output from the first quantizing means of the first ΔΣ modulator. A sampling frequency of the second ΔΣ modulator is higher than a sampling frequency of the first ΔΣ modulator. In this ΔΣ modulator, the operation means (such as a processor) applies a predetermined operation (namely, an operation carried out by an operation circuit constituted by a register and an EX-OR circuit) to the signal output from the second quantizing means, differentiates the signal obtained by the operation, and applies a predetermined operation to the differentiated signal and the digital signal output from the quantizing means of the first ΔΣ modulator. This configuration can also provide the functions as the above ΔΣ modulator.

The operation means may correct the digital signal output from the second quantizing means based on an "input-output frequency characteristic" of the oscillating means. By means of this non-linear correction, the conversion accuracy can be further increased.

Moreover, the operation means corrects the gain of the digital signal input from the second ΔΣ modulator or the second quantizing means.

Moreover the present invention provides a novel cascade type ΔΣ modulator. In other words, a sixth ΔΣ modulator according to the present invention includes a first ΔΣ modulator including an integrating means (integrator) that integrates an analog input signal, a quantizing means (quantizer) that quantizes an output signal from the integrating means, an adding means (adder) that inverts the polarity of an output signal from the quantizing means and adds the inverted output signal to the analog input signal, a second ΔΣ modulator that receives the signal output from the integrating means of the first ΔΣ modulator, a differentiating means (differential circuit) that differentiates a digital signal from the second ΔΣ modulator, and an operation means (such as a processor) that applies an operation to a digital signal output from the differentiating means and the digital signal output from the first ΔΣ modulator. A sampling frequency of the second ΔΣ modulator is higher than a sampling frequency of the first ΔΣ modulator.

Also in this ΔΣ modulator, the conversion accuracy is secured by setting the sampling frequency of the second ΔΣ modulator higher than the sampling frequency of the first ΔΣ modulator. Moreover, since the sampling frequency of the first ΔΣ modulator can be low, a ΔΣ modulator of a feedback system can be used as the first ΔΣ modulator. As a result, saturation of the integrating means of the first ΔΣ modulator will not pose a problem.

The aforementioned ΔΣ modulators of a frequency modulation system are preferably used as the second ΔΣ modulator.

Moreover, as the fifth ΔΣ modulator of the present invention, the "first ΔΣ modulator" may be constituted by a high-order ΔΣ modulator (feedback system) by increasing the number of the integrating means (integrators) and the feedbacks. Moreover, first-order ΔΣ modulators, which are constituted by the integrating means (integrator), the quantizing means (quantizer), and the adding means (adder), may be connected into multiple stages.

Moreover, in the above cascade type ΔΣ modulator, as in the above MASH type ΔΣ modulator, the differentiating means (differential circuit) that differentiates the digital signal from the second ΔΣ modulator may be omitted, and the output signal from the second ΔΣ modulator may be directly input to the operation means (processor). In other words, a cascade type ΔΣ modulator according to the present invention includes a first ΔΣ modulator including integrating means (integrator) that integrates an analog input signal, a quantizing means (quantizer) that quantizes an output signal from the integrating means, an adding means (adder) that inverts the polarity of an output signal from the quantizing means and adds the inverted output signal to the analog input signal, a second ΔΣ modulator that receives the signal output from the integrating means of the first ΔΣ modulator, and an operation means (such as a processor) that applies an operation to a digital signal output from the second ΔΣ modulator and the digital signal output from the quantizing means of the first ΔΣ modulator. A sampling frequency of the second ΔΣ modulator is higher than a sampling frequency of the first ΔΣ modulator.

Moreover, the second ΔΣ modulator of this ΔΣ modulator of cascade type may be replaced by oscillating means (oscillator) and quantizing means (quantizer). In other words, a ΔΣ modulator of cascade type according to the present invention includes a first ΔΣ modulator including integrating means (integrator) that integrates an analog input signal, first quantizing means (first quantizer) that quantizes an output signal from the integrating means, and adding means (adder) that inverts the polarity of an output signal from the first quantizing means, and adds the inverted output signal to the analog input signal, oscillating means (oscillator) that changes a frequency thereof according to a signal from the integrating means of the first ΔΣ modulator, second quantizing means (second quantizer) that quantizes an output signal output from the oscillating means, and operation means (such as a processor) that applies an operation to a digital signal output from the second quantizing means and the digital signal output from the first quantizing means of the first ΔΣ modulator. A sampling frequency of the second ΔΣ modulator is higher than a sampling frequency of the first ΔΣ modulator.

Moreover, the operation means may correct the digital signal output from the second quantizing means by means of an "input-output frequency characteristic" of the oscillating means, and further, may correct the gain of the digital signal input from the second ΔΣ modulator or the second quantizing means.

It should be noted that a high-precision analog-digital converter can be realized by constituting a ΔΣ analog-digital converter using any one of the above ΔΣ modulators.

BRIEF DESCRIPTION OF THE DRAWINGS

FIG. 6b is a block diagram showing a variation of the ΔΣ modulator shown in FIG. 6a.

FIG. 7 is a block diagram showing a variation of the ΔΣ modulator shown in FIG. 6a.

FIG. 8 is a block diagram showing another variation of the ΔΣ modulator shown in FIG. 6a.

BEST MODE FOR CARRYING OUT THE INVENTION

Figure 1:
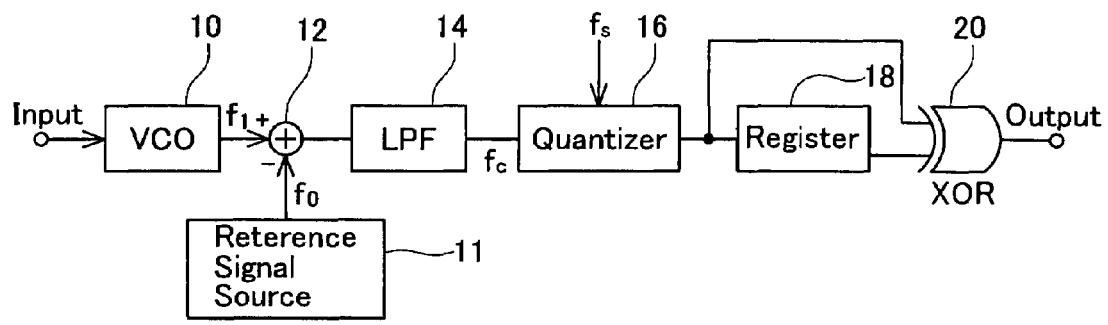
FIG. 1 is a block diagram showing an overall configuration of a ΔΣ modulator according to a first embodiment.

A description will now be given of a ΔΣ modulator according to an embodiment of the present invention. FIG. 1 shows a configuration of the ΔΣ modulator according to the present embodiment. The ΔΣ modulator according to the present embodiment includes a voltage-controlled oscillator 10 connected to an input terminal, a mixer 12 connected to the voltage-controlled oscillator 10, a low-pass filter 14 connected to the mixer 12, a quantizer 16 connected to the low-pass filter 14, and an operation circuit (a register 18 and an EX-OR circuit 20) connected to the quantizer 16.

The voltage-controlled oscillator 10 modulates an input control signal (namely, an analog signal input from the input terminal) into a predetermined frequency modulation range with a center oscillation frequency $f_1$. The voltage-controlled oscillator 10 thus outputs a frequency modulation signal whose frequency changes according to the voltage of the analog signal input from the input terminal.

The center oscillation frequency $f_1$ of the voltage-controlled oscillator 10 is set higher than a target center oscillation frequency of a frequency modulation signal (namely, signal to be input to the quantizer 16). Moreover, the frequency modulation range of the voltage-controlled oscillator 10 is set to the same frequency modulation range as that of the frequency modulation signal. For example, if one wants to set the frequency modulation signal input to the quantizer 16 from 500 MHz to 1.5 GHz, the center oscillation frequency $f_1$ of the voltage-controlled oscillator 10 is set to 10 GHz, and the frequency modulation range is set to ±500 MHz. In this case, a signal of 10 GHz±500 MHz is output from the voltage-controlled oscillator 10.

The frequency modulation signal output from the voltage-controlled oscillator 10 and a reference signal (frequency: $f_0$) output from a reference signal source 11 are input to the mixer 12. The mixer 12 mixes the input frequency modulation signal and the reference signal with each other. The reference signal input to the mixer 12 is opposite to the frequency modulation signal output from the voltage-controlled oscillator 10 in the frequency modulation direction. As a result, the frequency of a signal output from the mixer 12 is a value obtained by subtracting the frequency of the reference signal from the frequency of the frequency modulation signal output from the voltage-controlled oscillator 10.

On this occasion, the frequency $f_0$ of the reference signal is set according to the center oscillation frequency $f_1$ of the voltage-controlled oscillator 10 and the target center oscillation frequency of the frequency modulation signal (signal input to the quantizer 16). In other words, the frequency $f_0$ of the reference signal is set such that the value obtained by subtracting the frequency $f_0$ of the reference signal from the center oscillation frequency $f_1$ of the voltage-controlled oscillator 10 is the target center oscillation frequency of the signal. For example, if one wants to set the frequency modulation signal input to the quantizer 16 from 500 MHz to 1.5 GHz, and the center oscillation frequency $f_1$ of the voltage-controlled oscillator 10 is set to 10 GHz, the frequency $f_0$ of the reference signal is set to 9 GHz. In this case, the signal output from the mixer 12 is 1.0 GHz±500 MHz, which is the target frequency modulation range of the frequency modulation signal.

After high frequency components are removed by the low-pass filter 14, the frequency modulation signal output from the mixer 12 is input to the quantizer 16. The quantizer 16 identifies the input frequency modulation signal as a binary value, and outputs a signal at a voltage corresponding to the high level value or a signal at a voltage corresponding to the low level value.

Figure 2:
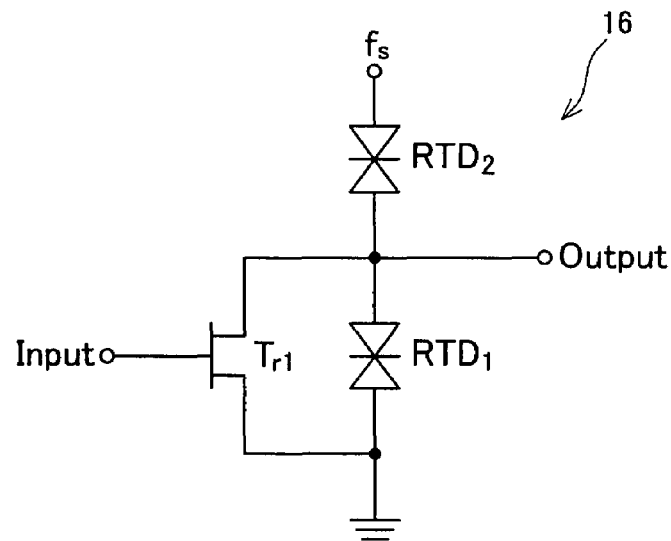
FIG. 2 is a circuit diagram showing a configuration example of a quantizer of the ΔΣ modulator shown in FIG. 1.

FIG. 2 shows a preferable configuration example of the quantizer 16. In the quantizer 16 shown in FIG. 2, two resonant tunnel diodes RTD1, RTD2 are serially connected between two terminals (clock terminal and ground terminal), and a field effect transistor Tr1 is connected to the one resonant tunnel diode RTD1 in parallel. A clock pulse voltage (period: fs) is impressed between the clock terminal and the ground terminal of the resonant tunnel diodes RTD1, RTD2, and the frequency modulation signal is input to the transistor Tr1 via a low-pass filter 14.

The resonant tunnel diodes RTD1, RTD2 are negative differential resistance elements which bear a negative differential resistance with a current-voltage characteristic of the N type (voltage control type). In the circuit where the resonant tunnel diodes RTD1, RTD2 are serially connected, a stable point of the system changes according to the voltage input to the clock terminal.

In other words, if the voltage input to the clock terminal is smaller than the voltage of the sum of the respective peak voltages of the two resonant tunnel diodes RTD1, RTD2 (if the peak voltages of both the elements are the same, twice of the peak voltage), the number of the stable points of the system is one (mono-stable state), and the output voltage is approximately half of the voltage input to the clock terminal.

On the other hand, if the voltage input to the clock terminal increases, and exceeds the sum of the respective peak voltages of the resonant tunnel diodes RTD1, RTD2, the number of the stable points of the system becomes two (bi-stable state), and the output voltage is $V_H$ (high level) or $V_L$ (low level) according to the stable points. As a result, if the clock signal input to the clock terminal periodically changes from a higher voltage to a lower voltage than the sum of the respective peak voltages of the resonant tunnel diodes RTD1, RTD2, a switching occurs if the voltage rises to the higher voltage. For the configuration where the two resonant tunnel diodes RTD1 and RTD2 are serially connected in this way, the mono-stable state transitions to the bi-stable state according to the clock signal.

On this occasion, which stable points of the two stable points the state settles down to (which voltage $V_H$ or $V_L$ the output voltage becomes) depends on the difference between the peak currents of the two resonant tunnel diodes RTD1, RTD2. For example, if the peak current of the lower resonant tunnel diode RTD1 is larger than the peak current of the upper resonant tunnel diode RTD2, the output voltage is $V_L$. In the opposite case, the output voltage is $V_H$. The transistor Tr1 changes the peak current of the resonant tunnel diode RTD1 according to the input voltage. As a result, there may be provided a setting that the output voltage is $V_H$ if the input voltage is at the low level and the transistor Tr1 is turned off, and that the output voltage is $V_L$ if the input voltage is at the high level and the transistor Tr1 is turned on. This setting can cause this logic circuit to operate as an inverter.

As the above description clearly shows, the circuit shown in FIG. 2 can be switched between the mono-stable state and the bi-stable state according to the clock signal, and the output voltage is $V_H$ (high level) or $V_L$ (low level) according to the voltage input to the transistor Tr1 in the bi-stable state. As a result, the circuit shown in FIG. 2 can be used as the quantizer which identifies the input frequency modulation signal as a binary value.

Moreover, the sampling frequency of the quantizer 16 shown in FIG. 2 is the frequency (fs) of the clock signal input to the resonant tunnel diodes RTD1, RTD2. The sampling frequency of the quantizer 16 is set to a sufficiently high frequency with respect to the frequency modulation range of the frequency modulation signal input to the quantizer 16. For example, if the input frequency modulation signal is 1.0 GHz±500 MHz, the sampling frequency of the quantizer 16 is set to 4.0 GHz.

It should be noted that the above configuration of the logic circuit employing the resonant tunnel diodes is disclosed in detail in Japanese Laid-Open Patent Publication No. 2002-261615, and Japanese Laid-Open Patent Publication No. 2003-87111. Moreover, an element bearing the negative differential resistance includes an Esaki diode as well as the resonant tunnel element, and the quantizer may be constituted by these elements bearing the negative differential resistance. Moreover, a field effect transistor as well as a bipolar transistor can be used as the transistor.

The operation circuit connected to the output side of the quantizer 16 is constituted by the register 18 and the EX-OR circuit 20. The register 18 stores the signal output from the quantizer 16 at the same sampling frequency as the sampling frequency fs of the quantizer 16. As a result, the register 18 outputs the signal output one period before from the quantizer 16 to the EX-OR circuit 20. As a result, the EX-OR circuit 20 outputs a signal of only one pulse if the output of the quantizer 16 changes "1" to "0", and if the output of the quantizer 16 changes "0" to "1".

A description will now be given of the operation of the ΔΣ modulator. If the analog signal is input from the input terminal, the voltage-controlled oscillator 10 applies the frequency modulation to the input analog signal. On this occasion, the voltage-controlled oscillator 10 modulates the input analog signal to the frequency range (for example, 10 GHZ±500 MHz) higher than the target frequency range (for example, 500 MHz to 1.5 GHz).

The frequency modulation signal output from the voltage-controlled oscillator 10 is mixed with the reference signal (for example, 9 GHz) by the mixer 12, and the frequency thereof falls in the target frequency range (for example, 500 MHz to 1.5 GHz). The high frequency components (noise components) of the signal from the mixer 12 are removed by the low-pass filter 14, and the resulting signal is quantized by the quantizer 16. The operation is applied by the register 18 and the EX-OR circuit 20 to the output of the quantizer 16 to convert the output into the pulse density signal.

As the above description clearly shows, in the ΔΣ modulator according to the present embodiment, the voltage-controlled oscillator 10 carries out the frequency modulation to a higher frequency than that of the target frequency range, and the frequency modulation signal is mixed with the reference signal to obtain the frequency modulation signal in the target frequency range. As a result, it is possible to decrease the frequency modulation range of the voltage-controlled oscillator 10 with respect to the center oscillation frequency. As a result, it is possible to significantly lessen the requirement of linearity with respect to the input signal required for the voltage-controlled oscillator 10.

For example, if the target frequency range is 500 MHz to 1.5 GHz, usually, the center oscillation frequency is 1 GHz, and the frequency modulation range is ±500 MHz. However, it is extremely difficult to maintain the linearity when the center oscillation frequency is 1 GHz, and the frequency modulation range is ±500 MHz (50% of the frequency modulation range with respect to the center oscillation frequency). On the other hand, according to the present embodiment, the center oscillation frequency is 10 GHz, the frequency modulation range is ±500 MHz (frequency modulation range is 5% with respect to the center oscillation frequency), and it is thus easy to maintain the linearity in this frequency modulation range compared with the above case.

Moreover, in the ΔΣ modulator according to the present embodiment, the resonant tunnel diodes are used for the quantizer 16. The resonant tunnel diode can operate at a very high speed, and it is thus possible to cause the quantizer 16 to operate at a high speed. Consequently, it is possible to increase the sampling frequency of the quantizer 16, and thus to increase the conversion accuracy.

Though the quantizer configured as shown in FIG. 2 is used for the above embodiment, various configurations can be employed for the quantizer. For example, a configuration shown in FIG. 3 can be employed. In a quantizer shown in FIG. 3, the input signal is input via a capacitor C to the connection point of the two resonant tunnel diodes RTD1, RTD2 connected serially. Moreover, clock signals are respectively input to both ends of the two resonant tunnel diodes RTD1, RTD2. Specifically, a clock signal including a predetermined DC bias voltage is applied to the resonant tunnel diode RTD2. A clock signal, which is different in phase from the clock signal by 180 degrees, along with the predetermined DC bias voltage, is applied to the resonant tunnel diode RTD1.

With this configuration, the circuit is symmetrical with respect to the switching between the high level and the low level of the clock signals, and a stable operation is thus provided on a rise of the clock signals. It is thus possible to increase the frequency of the clock signals, resulting in a higher speed of the quantizer. Moreover, if the number of the input to this circuit is increased to two or more, it is possible to easily carry out a logical operation of weighted summation threshold logical operation, and thus to use this circuit as a logic element.

Figure 3:
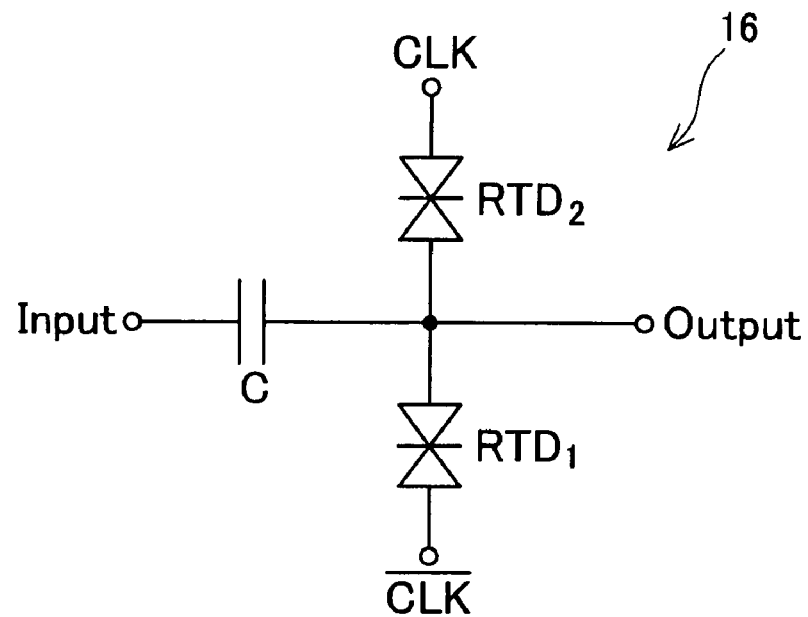
FIG. 3 is a circuit diagram showing another configuration example of the quantizer.
Figure 4:
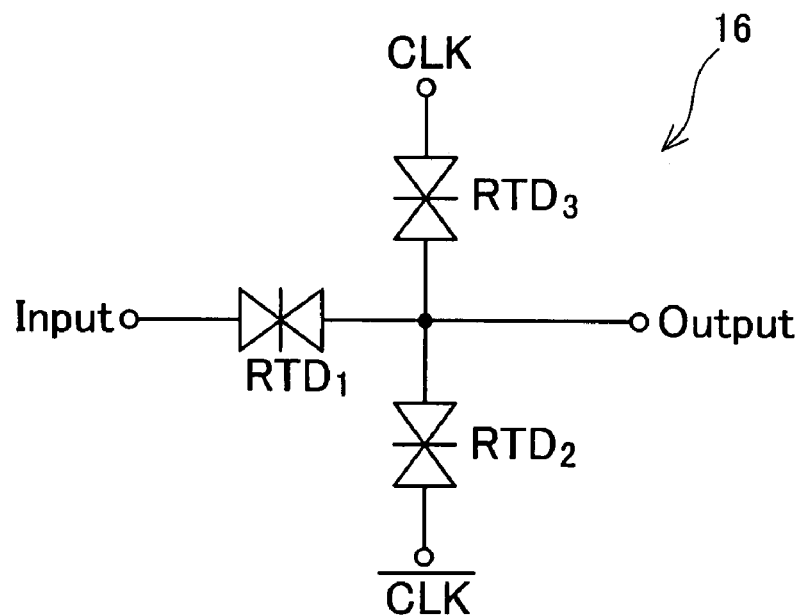
FIG. 4 is a circuit diagram showing another configuration example of the quantizer.

Though the capacitor is connected to the input side of the two resonant tunnel diodes in FIG. 3, the impedance element connected to the input side is not limited to the capacitor, and may be a resistor, an inductor, or a combination thereof. Moreover, a resonant tunnel diode may further be connected to the input side of the two resonant tunnel diodes as shown in FIG. 4.

Second Embodiment

Figure 5:
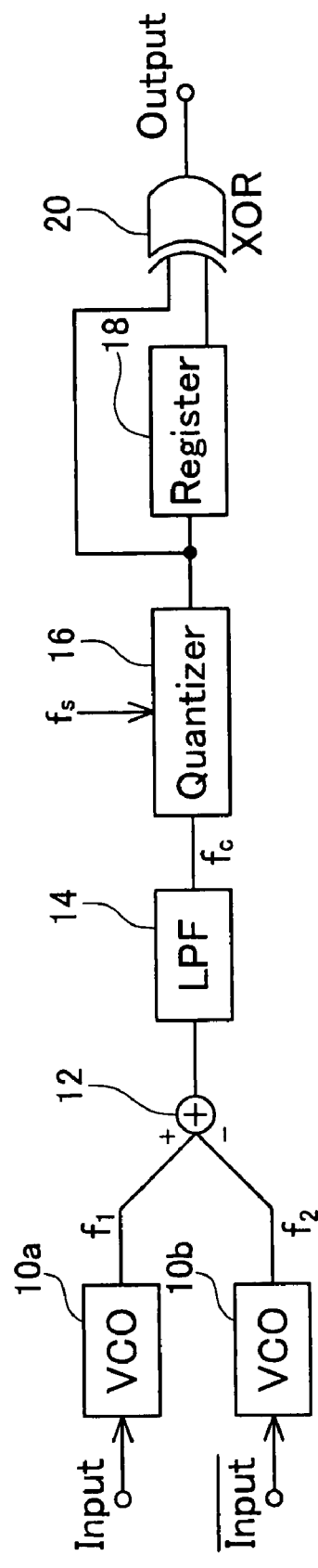
FIG. 5 is a block diagram showing an overall configuration of a ΔΣ modulator according to a second embodiment.

A description will now be given of a ΔΣ modulator according to a second embodiment of the present invention. FIG. 5 is a block diagram showing a configuration of the ΔΣ modulator according to the second embodiment. As FIG. 5 clearly shows, the ΔΣ modulator according to the second embodiment has a configuration approximately similar to that of the ΔΣ modulator according to the first embodiment, and is different only in frequency modulation signals input to the mixer 12.

The second embodiment includes two voltage-controlled oscillators 10a and 10b. A signal $f_1$ is obtained by frequency modulation by the voltage-controlled oscillator 10a. A signal $f_2$ is obtained by frequency modulation by the voltage-controlled oscillator 10b. The signal $f_1$ and the signal $f_2$ are mixed by the mixer 12. An analog signal input to the voltage-controlled oscillator 10b is complementary in polarity with respect to an analog signal input to the voltage-controlled oscillator 10a. Therefore, if the signal $f_1$ frequency-modulated by the voltage-controlled oscillator 10a, and the signal $f_2$ frequency-modulated by the voltage-controlled oscillator 10b are mixed, a subtraction is carried out for the center oscillation frequencies thereof, and an addition is carried out for the frequency modulation ranges thereof. Therefore, the center oscillation frequencies and the frequency modulation ranges of the two voltage-controlled oscillators 10a and 10b are set according to the target frequency modulation range of the frequency modulation signal. For example, the target frequency range of the frequency modulation signal is 500 MHz to 1.5 GHz, the frequency modulation range of the voltage-controlled oscillator 10a is 10 GHz±250 MHz, and the frequency modulation range of the voltage-controlled oscillator 10b is 9 GHz±250 MHz.

In the ΔΣ modulator according to the second embodiment, since the complementary analog signals are input to the voltage-controlled oscillators 10a, 10b, it is possible to lessen more required linearity for the voltage-controlled oscillators 10a, 10b. Moreover, since the same analog signals are input for the control, there is also an advantage that noises (such as a noise caused by the power supply) acting similarly on both of them are cancelled out.

In the ΔΣ modulator according to the second embodiment, the signal $f_1$ output from the voltage-controlled oscillator 10a and the signal $f_2$ output from the voltage-controlled oscillator 10b are mixed by the mixer 12, and the signal obtained as a result of the mixing by the mixer 12 is input to the quantizer 16. However, a ΔΣ modulator equivalent to the second embodiment may also be realized by a configuration shown in FIG. 31.

Figure 31:
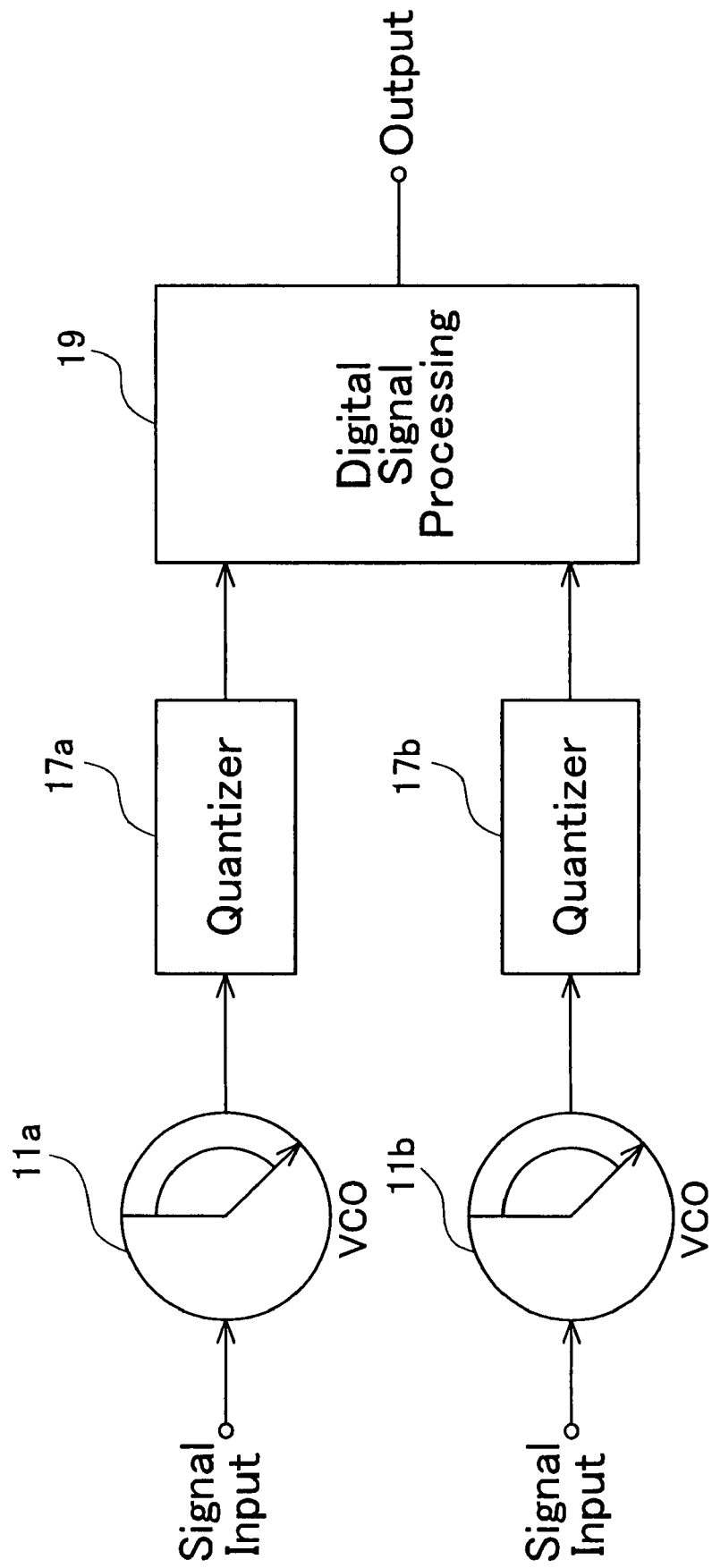
FIG. 31 is a block diagram showing an overall configuration of a ΔΣ modulator equivalent to the ΔΣ modulator shown in FIG. 5.

That is, as shown in FIG. 31, this ΔΣ modulator also includes a voltage-controlled oscillator 11a which changes a frequency thereof according to an input signal, and a voltage-controlled oscillator 11b which changes a frequency thereof according to an input signal. The analog signal input to the voltage-controlled oscillator 11a and the analog signal input to the voltage-controlled oscillator 11b are complementary in terms of polarity.

The signal output from the voltage-controlled oscillator 11a is input to a quantizer 17a. The signal output from the voltage-controlled oscillator 11b is input to a quantizer 17b. The quantizers 17a, 17b quantize the input signals, and output the quantized signals to a digital signal processing circuit (processor) 19.

The digital signal processing circuit 19 applies a predetermined operation (operation carried out by a register and an EX-OR circuit) to the digital signal input from the quantizer 17a and the digital signal input from the quantizer 17b, and then carries out a subtraction. As a result, the digital signal processing circuit 19 outputs a multi-value pulse density signal according to the input analog signal.

Also in this ΔΣ modulator, since the same analog signals are input to the voltage-controlled oscillator 11a and the voltage-controlled oscillator 11b, it is possible to remove noises (such as noises caused by a power supply and a circuit board) and even-order non-linear components common to both of them.

Even for this ΔΣ modulator, it is preferable to set the center oscillation frequencies (namely, carrier frequencies) of the voltage-controlled oscillators 11a, 11b higher than the target center oscillation frequency (sampling frequencies of the quantizers 17a, 17b) of the frequency modulation signal. This is because it is possible to lessen the linearity requirement for the voltage-controlled oscillators 11a, 11b.

Third Embodiment

Figure 6A:
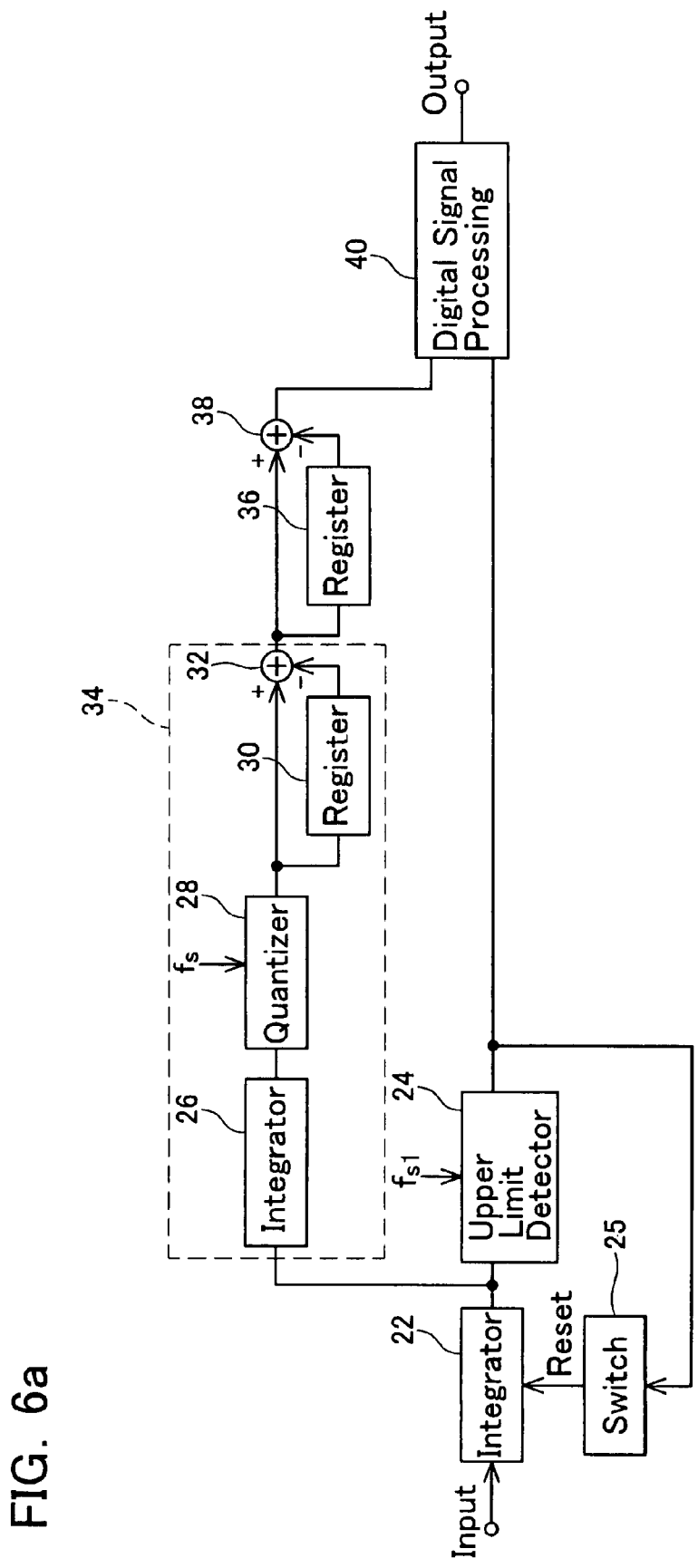
FIG. 6a is a block diagram showing an overall configuration of a ΔΣ modulator according to a third embodiment.

A description will now be given of a ΔΣ modulator according to a third embodiment of the present invention. FIG. 6a shows a configuration of the ΔΣ modulator according to the third embodiment. The ΔΣ modulator according to the third embodiment includes an integrator 22 which receives an analog signal, a first-order ΔΣ modulator 34 connected to the integrator 22, a differential circuit (register 36 and adder 38) connected to the first-order ΔΣ modulator 34, an upper limit detector 24 connected to the integrator 22, and a digital signal processing circuit 40 connected to the differential circuit and the upper limit detector 24.

The integrator 22 integrates an analog signal input from an input terminal. The analog signal input to the integrator 22 is adjusted so as to be a positive value by adding a proper DC bias voltage. As a result, an output of the integrator 22 monotonically increases as time elapses. Since the output of the integrator 22 monotonically increases, the output of the integrator 22 will saturate. To address this problem, the present embodiment provides the upper limit detector 24 which detects the output of the integrator 22 to prevent the integrator 22 from saturating.

The upper limit detector 24 detects whether the output of the integrator 22 exceeds a predetermined threshold. If the output of the integrator 22 exceeds the predetermined threshold, the upper limit detector 24 operates a switch 25 to short-circuit an output terminal of the integrator 22. This can reset the output of the integrator 22. Thus, the switch 25 which resets the output terminal of the integrator 22 corresponds to the resetting means described in the claims.

Moreover, if the upper limit detector 24 detects that the output of the integrator 22 exceeds the predetermined threshold, the upper limit detector 24 outputs a pulse signal to the digital signal processing circuit 40. As a result, the digital signal processing circuit 40 recognizes that the integrator 22 is reset.

The frequency fs at which the upper limit detector 24 operates (namely, the period to determine whether the output of the integrator 22 exceeds the predetermined threshold) is set lower than the sampling frequency fs of the quantizer 28 of the first-order $\Delta\Sigma$ modulator 34. This is because while the upper limit detector 24 simply resets the integrator 22, the operation speed of the quantizer 28 determines the conversion accuracy of the $\Delta\Sigma$ modulator, and it is thus necessary to increase the operation speed.

The output from the integrator 22 is input to the first-order $\Delta\Sigma$ modulator 34. The first-order $\Delta\Sigma$ modulator 34 can be constituted by an integrator 26, a quantizer 28, and a differential circuit (register 30 and an adder 32). Operations of these respective parts are the same as those of a publicly known first-order $\Delta\Sigma$ modulator 34.

Figure 6B:
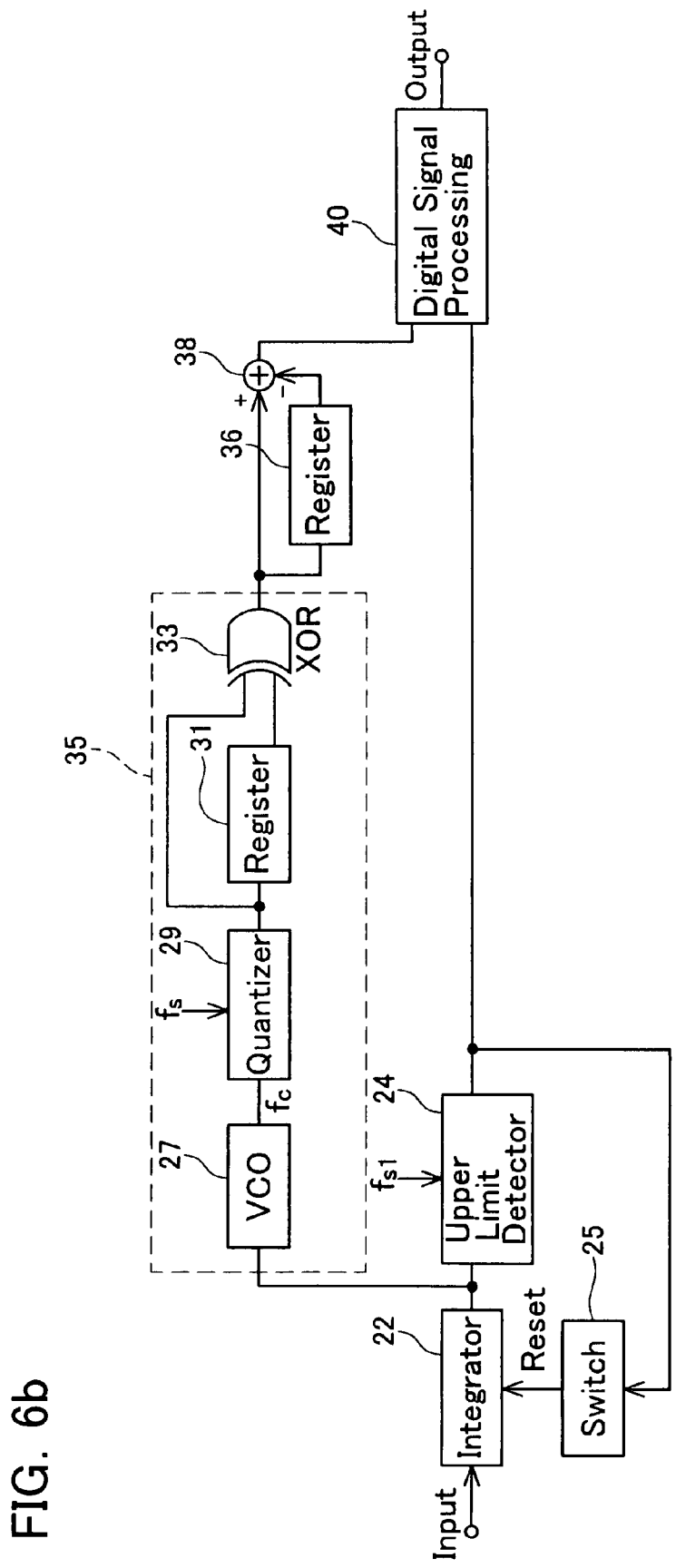

The first-order $\Delta\Sigma$ modulator 34 is preferably a $\Delta\Sigma$ modulator of a frequency modulation system. In other words, the first-order $\Delta\Sigma$ modulator 34 preferably employs a configuration shown in FIG. 6b. Employment of a $\Delta\Sigma$ modulator of a frequency modulation system eliminates the problem of the saturation of the integrator 26. Moreover, if the $\Delta\Sigma$ modulator according to the first embodiment or the second embodiment is used as the first-order $\Delta\Sigma$ modulator 34, the problem of the linearity of the voltage-controlled oscillator does not occur, and the quantizer can operate at a high speed.

The differential circuit connected to the output side of the first-order $\Delta\Sigma$ modulator 34 is constituted by the register 36 and the adder 38. The register 36 stores an output from the first-order $\Delta\Sigma$ modulator 34 at the same period as the sampling period fs of the first-order $\Delta\Sigma$ modulator 34. The output from the first-order $\Delta\Sigma$ modulator 34 and the output stored in the register 36 (the output from the first-order $\Delta\Sigma$ modulator 34 one period ago) are thus input to the adder 38. The adder 38 subtracts the output stored in the register 36 from the output from the first-order $\Delta\Sigma$ modulator 34. An output from the adder 38 thus is a result of the subtraction of the output one period ago of the first-order $\Delta\Sigma$ modulator 34 from the present output of the first-order $\Delta\Sigma$ modulator 34 (namely, a derivative of the output from the first-order $\Delta\Sigma$ modulator 34).

On this occasion, the output of the integrator 22 is not an actual integration of the input analog signal, but a value obtained by subtracting from a value calculated from the resets of the upper limit detector 24 (number of resets×predetermined value) from the actual integration. As a result, the pulse density signal output from the adder 38 is not obtained by converting the actual integration of the input analog signal. The digital signal processing circuit 40 thus counts the pulse signal output from the upper limit detector 24, and corrects the pulse density signal output from the adder 38 based on the count. An output from the digital signal processing circuit 40 is a result obtained by converting the input analog signal into the pulse density signal.

As the above description clearly shows, the $\Delta\Sigma$ modulator according to the third embodiment constitutes a second-order $\Delta\Sigma$ modulator by providing the integrator 22 on the input side of the first-order $\Delta\Sigma$ modulator 34 and providing the differential circuit (36, 38) on the output side of the first-order $\Delta\Sigma$ modulator 34 without feeding back the output signal. If the output signal is not fed back (though there arises the problem of the saturation of the integrator 22, since the output of the integrator 22 is reset by the upper limit detector 24 according to the present embodiment) the saturation of the integrator 22 does not occur. Moreover, if a $\Delta\Sigma$ modulator of frequency modulation system is employed as the first-order $\Delta\Sigma$ modulator 34, the problem of saturation of the integrator 26 of the first-order $\Delta\Sigma$ modulator 34 will not occur. Thus, according to the third embodiment, it is possible to constitute a second-order $\Delta\Sigma$ modulator without the feedback of the output signal. As a result, the speed of the second-order $\Delta\Sigma$ modulator can be increased.

According to the third embodiment, though the output of the upper limit detector 24 is fed back to the integrator 22, this feedback is to reset the integrator 22, and is not necessarily as accurate as that in a $\Delta\Sigma$ modulator. Therefore, the operation frequency of the upper limit detector 24 can be set low, and this feedback does not adversely affect the operation speed of the first-order $\Delta\Sigma$ modulator 34.

Figure 7:
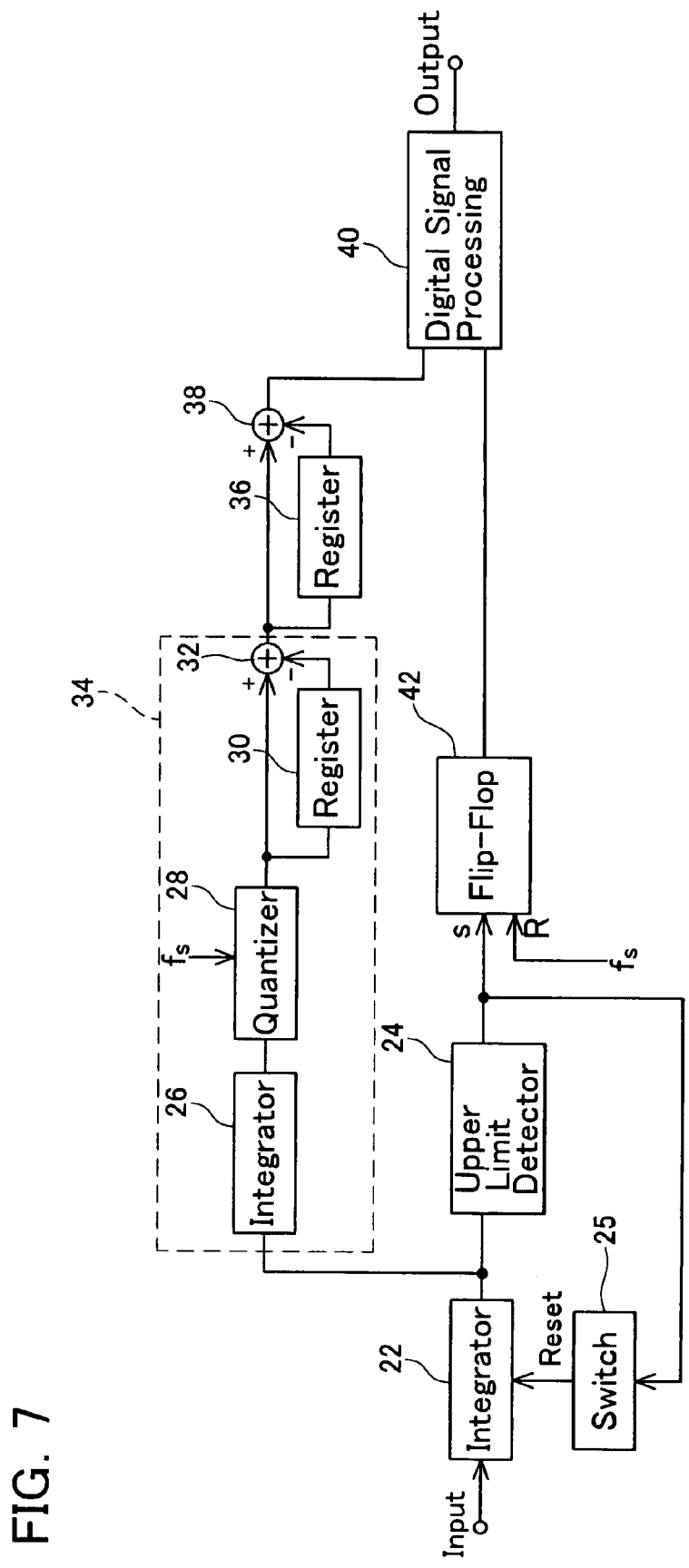

It should be noted that the $\Delta\Sigma$ modulator according to the third embodiment may be embodied in various modified forms. For example, the $\Delta\Sigma$ modulator according to the third embodiment may be embodied in a form shown in FIG. 7. The $\Delta\Sigma$ modulator shown in FIG. 7 is different from the $\Delta\Sigma$ modulator according to the third embodiment shown in FIG. 6a, in that a clock signal is not supplied to the upper limit detector 24, and the upper limit detector 24 is asynchronously operated. As a result, in order to synchronize the pulse signal from the upper limit detector 24, an RS flip-flop 42 is provided between the upper limit detector 24 and the digital signal processing circuit 40.

Figure 8:
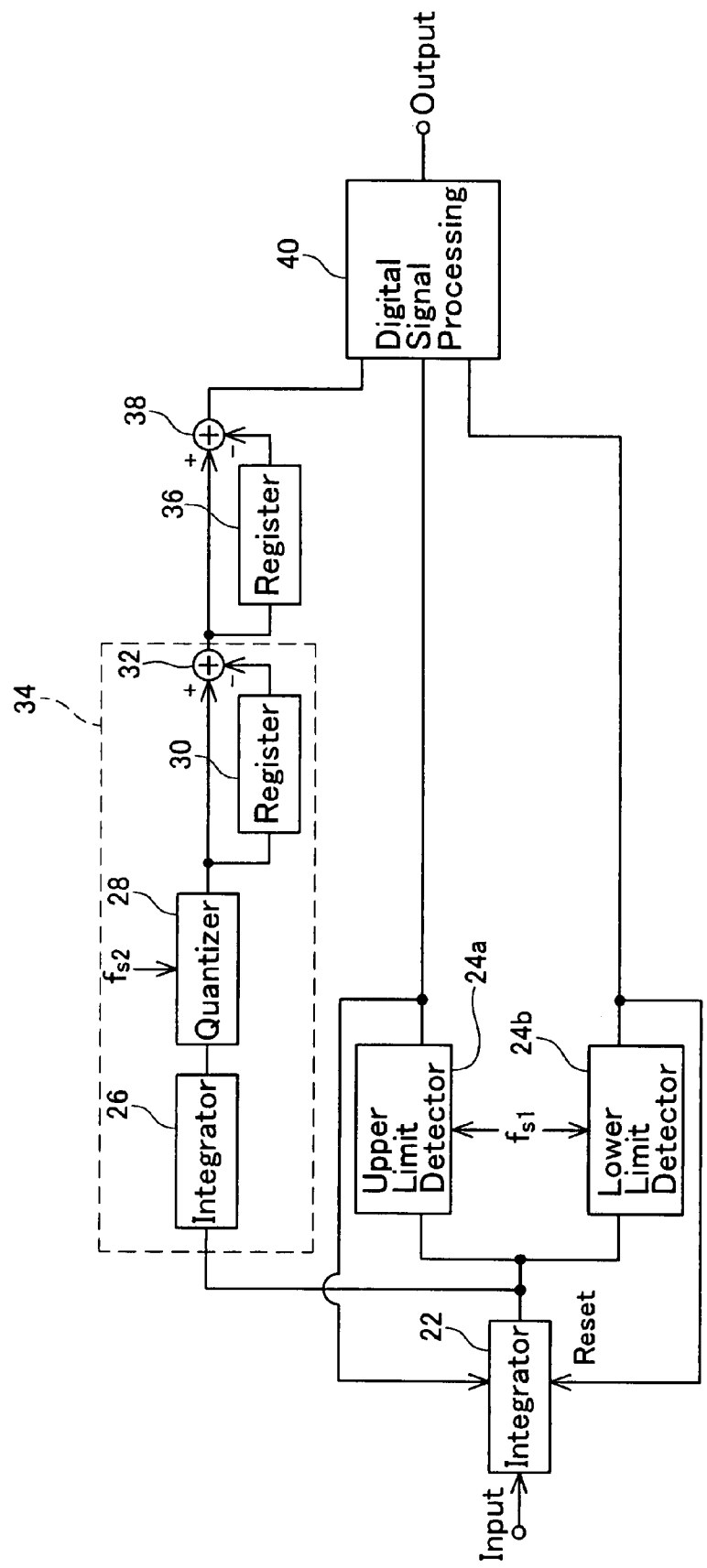

Moreover, the $\Delta\Sigma$ modulator may be embodied in a form shown in FIG. 8. The $\Delta\Sigma$ modulator shown in FIG. 8 is different from the $\Delta\Sigma$ modulator shown in FIG. 6a, and is improved to address a case where the input analog signal takes positive and negative values. In this embodiment, the output of the integrator 22 is monitored by an upper limit detector 24a and a lower limit detector 24b. Then, if the output of the integrator 22 exceeds a first predetermined value, the upper limit detector 24a sets the output of the integrator 22 to a first level (minimum level). On the other hand, if the output of the integrator 22 falls below a second predetermined value (<first predetermined value), the lower limit detector 24b sets the output of the integrator 22 to a second level (maximum level). As a result, even if the input analog signal takes positive and negative values, the input signal can be modulated into a pulse density signal. It should be noted that the digital signal processing circuit 40 has to distinguish between the pulse signal output from the upper limit detector 24a and the pulse signal output from the lower limit detector 24b. For that purpose, in the example shown in FIG. 8, the lower limit detector 24b and the digital signal processing circuit 40 are connected with each other via a wire different from a wire connecting the upper limit detector 24a to the digital signal processing circuit 40.

It should be noted that the wire connecting the upper limit detector 24a to the digital signal processing circuit 40 and the wire connecting the lower limit detector 24b to the digital signal processing circuit 40 may be unified into the same wire. In this case, the pulse signal output from the upper limit detector 24a and the pulse signal output from the lower limit detector 24b may have a polarity different from each other.

Moreover, in the ΔΣ modulator shown in FIG. 8, as the ΔΣ modulator shown in FIG. 7, the upper limit detector 24a and the lower limit detector 24b may operate asynchronously. In this case, an RS flip-flop 42 may be provided between the respective detectors 24a, 24b and the digital signal processing circuit 40.

Moreover, in the respective ΔΣ modulators shown in FIGS. 6a, 6b, 7, and 8, it is possible to constitute a higher-order ΔΣ modulator by providing multiple integrators on the input side of the first-order ΔΣ modulator 34, and providing corresponding differential circuits on the output side of the first-order ΔΣ modulator 34. If a high-order ΔΣ modulator is constituted, a detecting circuit is provided for the respective integrators to reset the output of the integrators.

Fourth Embodiment

Figure 9:
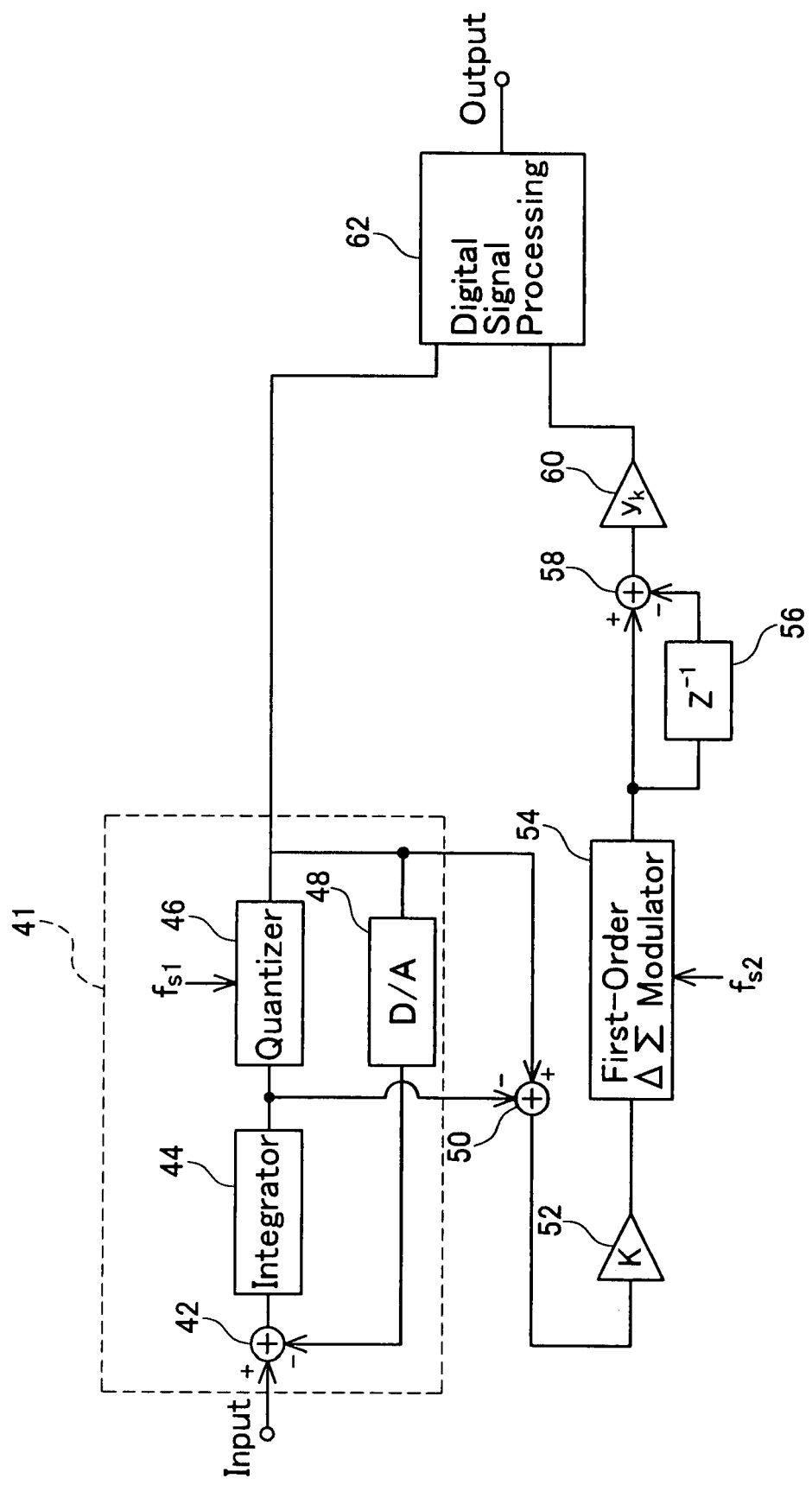
FIG. 9 is a block diagram showing an overall configuration of a ΔΣ modulator according to a fourth embodiment.

A description will now be given of a ΔΣ modulator according to a fourth embodiment of the present invention. FIG. 9 shows a configuration of the ΔΣ modulator according to the fourth embodiment. The ΔΣ modulator according to the fourth embodiment is a so-called MASH type ΔΣ modulator. This ΔΣ modulator includes a ΔΣ modulator (42, 44, 46, 48) on a first stage, and a ΔΣ modulator 54 on a second stage.

The ΔΣ modulator on the first stage is a ΔΣ modulator of feedback system. In other words, the ΔΣ modulator on the first stage includes an integrator 44 which integrates an input signal, a quantizer 46 which quantizes an output of the integrator 44, a digital-analog converter 48 which converts a digital output of the quantizer 46 into an analog signal, and an adder 42 which inverts the polarity of the analog signal converted by the digital-analog converter 114 and adds the inverted analog signal to the input analog signal.

The ΔΣ modulator on the first stage is connected to the ΔΣ modulator 54 on the second stage via an adder 50. The output from the quantizer 46 and the output from the integrator 44 are input to the adder 50. The adder 50 inverts the polarity of the output from the integrator 44, and adds the inverted output to the output from the quantizer 46. An output from the adder 50 is input to the ΔΣ modulator 54 on the second stage via an amplifier 52.

The ΔΣ modulator 54 on the second stage is a ΔΣ modulator of a frequency modulation system. A sampling frequency fs2 of the ΔΣ modulator 54 is set higher than a sampling frequency fs1 of the ΔΣ modulator (namely the quantizer 46) on the first stage.

It should be noted that the ΔΣ modulator according to the first or second embodiment may be used as the ΔΣ modulator 54. The employment of the ΔΣ modulator according to the first or second embodiment enables an increase of the sampling frequency fs2, thereby operating the ΔΣ modulator 54 on the second stage at a high speed.

An output of the ΔΣ modulator 54 is input to a digital signal processing circuit 62 via a differential circuit (56, 58) and an amplifier 60. The output from the quantizer 46 of the ΔΣ modulator on the first stage is also input to the digital signal processing circuit 62. The digital signal processing circuit 62 processes (applies an operation to) the signals from the ΔΣ modulator on the first stage and the ΔΣ modulator 54 on the second stage, and outputs a pulse density signal according to the input analog signal. The processing by the digital signal processing circuit 62 can be the same as that of the publicly known processing of a MASH type ΔΣ modulator.

The amplifier 52 is provided on the input side of the ΔΣ modulator 54 on the second stage and the amplifier 60 is provided on the output side of the ΔΣ modulator 54 on the second stage in order to prevent the input to the ΔΣ modulator 54 on the second stage from excessively increasing.

In the ΔΣ modulator according to the fourth embodiment, the overall accuracy is determined by the accuracy of the ΔΣ modulator 54 on the second stage. Therefore, the ΔΣ modulator (42, 44, 46, 48) on the first stage does not have to operate at a high speed, and the ΔΣ modulator (42, 44, 46, 48) on the first stage is a ΔΣ modulator of a feedback system. As a result, the integrator 44 of the ΔΣ modulator (42, 44, 46, 48) on the first stage is prevented from saturating. On the other hand, the ΔΣ modulator 54 on the second stage employs a ΔΣ modulator of a frequency modulation system, and the sampling frequency fs2 is set high. As a result, the input analog signal can be converted into the pulse density signal with high accuracy.

Though the above ΔΣ modulator according to the fourth embodiment is the MASH type ΔΣ modulator on two stages, according to the technology of the present invention, it is possible to constitute MASH type ΔΣ modulators on multiple stages. If ΔΣ modulators are configured in multiple stages, ΔΣ modulators before the last stages may be ΔΣ modulators of a feedback system, and the ΔΣ modulator on the last stage can be a ΔΣ modulator of a frequency modulation system. As a result, while integrators of the ΔΣ modulators before the last stages are prevented from saturating, and the ΔΣ modulator on the last stage can be operated at a high speed, resulting in a high conversion accuracy. Moreover, the ΔΣ modulator on the first stage can be a high-order ΔΣ modulator, resulting in a high conversion accuracy.

Figure 10:
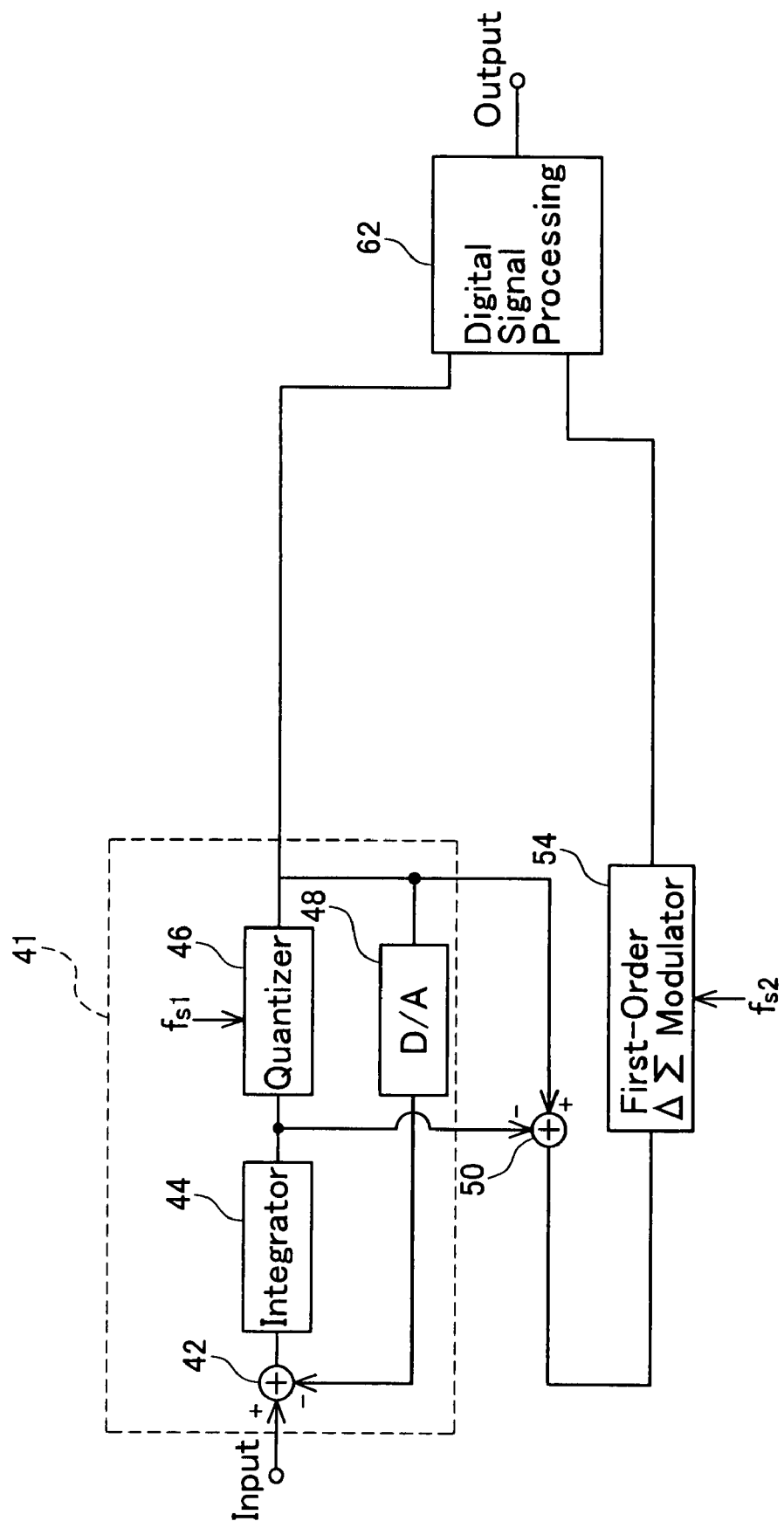
FIG. 10 is a block diagram showing a variation of the ΔΣ modulator shown in FIG. 9.

Moreover, as shown in FIG. 10, the amplifier 52, the differential circuit (56, 58), and the amplifier 60, which are provided on the side of the ΔΣ modulator 54 on the second stage in the ΔΣ modulator shown in FIG. 9, may be removed, and the output of the ΔΣ modulator 54 on the second stage may be directly input to the digital signal processing circuit 62. In this case, the digital signal processing circuit 62 carries out gain correction and differentiation of the output of the ΔΣ modulator 54, and then, carries out a process to convert the result into a pulse density signal.

Figure 11:
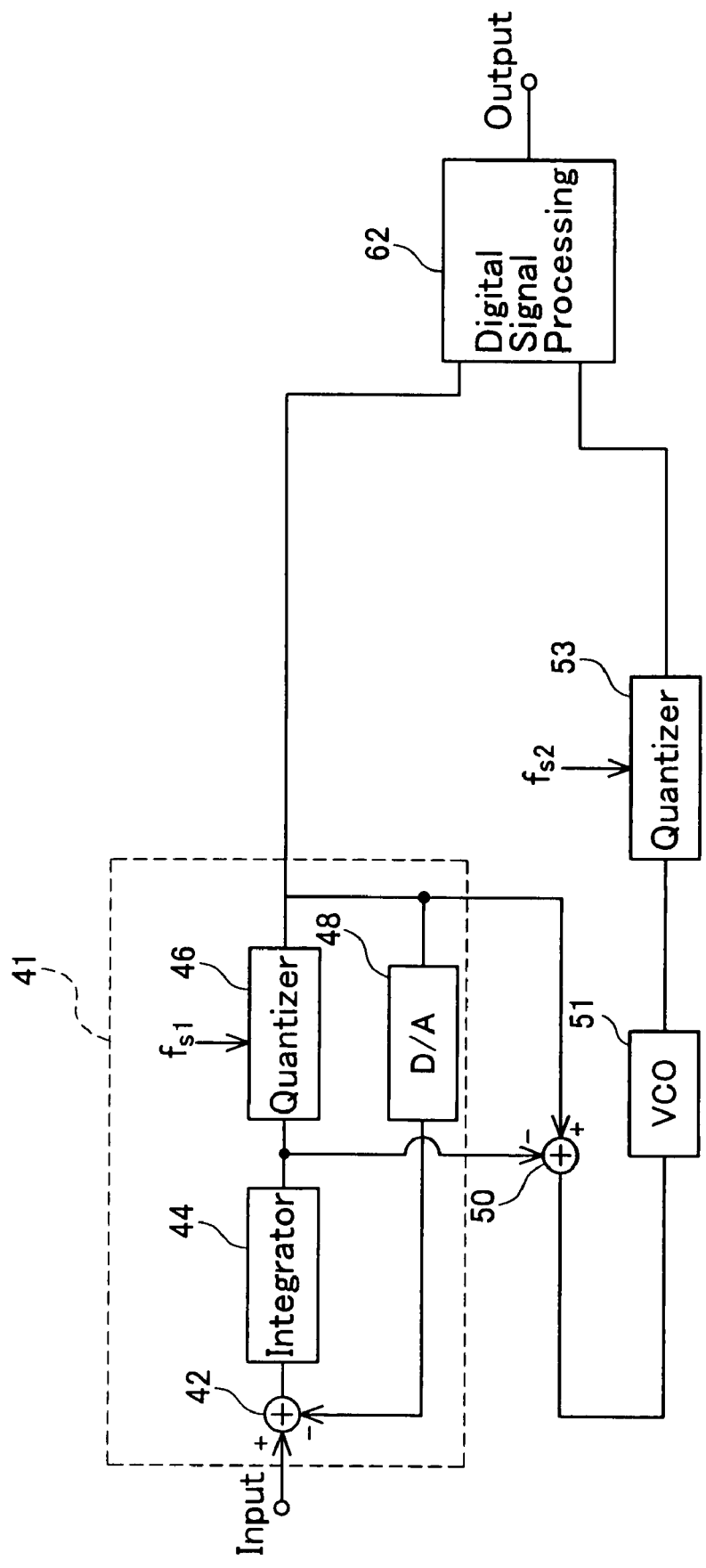
FIG. 11 is a block diagram showing another variation of the ΔΣ modulator shown in FIG. 9.

Further, the ΔΣ modulator 54 on the second stage in the ΔΣ modulator shown in FIG. 10 may be replaced by an oscillator 51 and a quantizer 53 as shown in FIG. 11. In this case, the digital signal processing circuit 62 applies a predetermined logical operation (operation carried out by the register 18 and the EX-OR circuit 20 in FIG. 1) to the output of the quantizer 53, carries out the gain correction and the differentiation, and then, carries out a process of conversion into the pulse density signal. In the ΔΣ modulator shown in FIG. 11, the digital signal processing circuit 62 preferably corrects the signal output from the quantizer 53 in consideration of an input-output frequency characteristic of the oscillator 51. As a result, it is possible to more accurately convert the signal into the pulse density signal. It should be noted that the correction in consideration of the input-output frequency characteristic of the oscillator 51 may be carried out by measuring the input-output frequency characteristic of the oscillator 51 in advance, and then carrying out the correction based on a measured result. Alternatively, a measuring device which measures the input-output characteristic of the oscillator 51 may be independently provided, an output from the measuring device may be input to the digital signal processing circuit 62, and the correction may be carried out based on the input.

Fifth Embodiment

Figure 12:
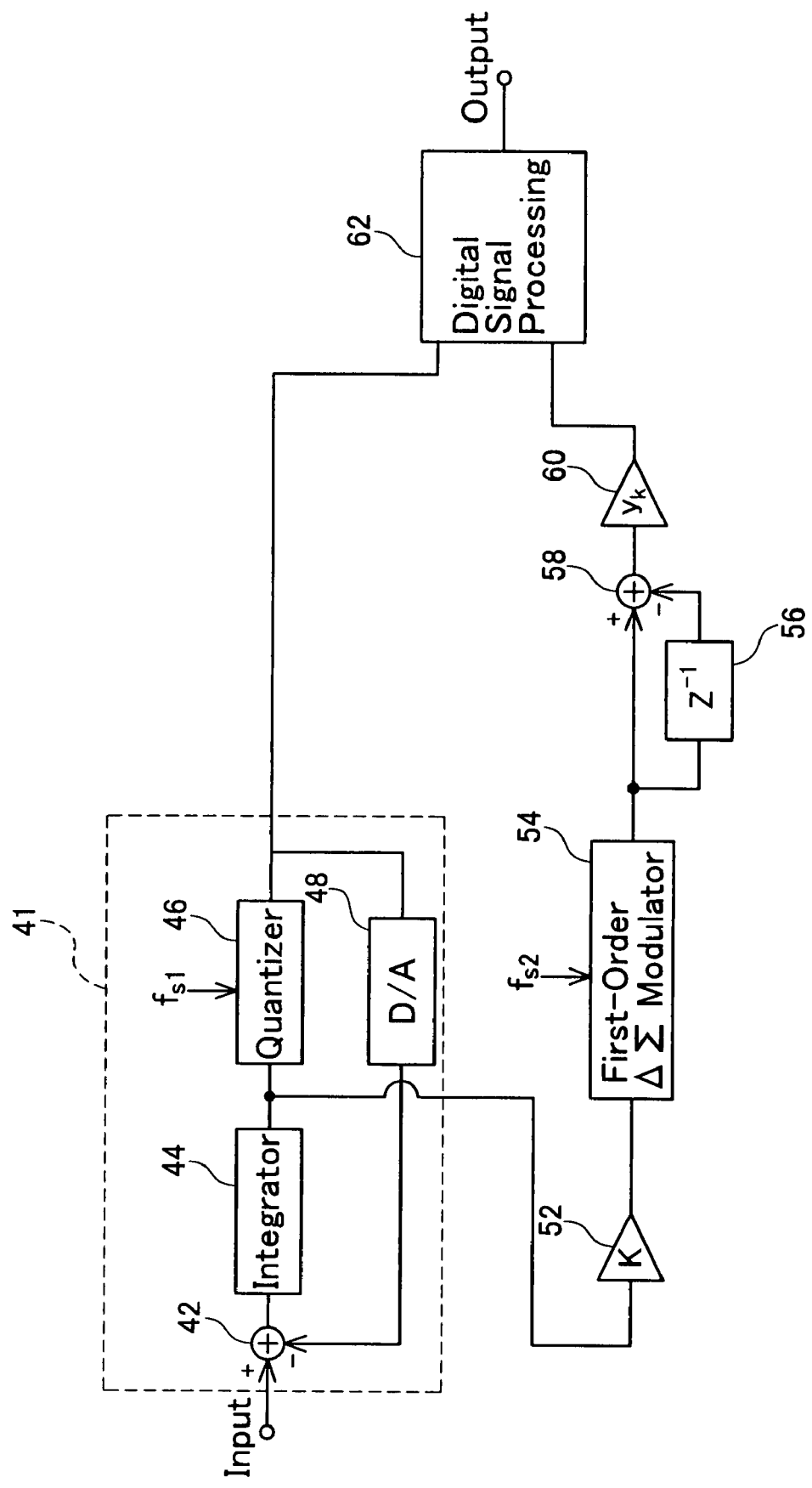
FIG. 12 is a block diagram showing an overall configuration of a ΔΣ modulator according to a fifth embodiment.

A description will now be given of a ΔΣ modulator according to a fifth embodiment of the present invention. FIG. 12 shows a configuration of the ΔΣ modulator according to the fifth embodiment. The ΔΣ modulator according to the fifth embodiment is a so-called cascade type ΔΣ modulator, and is configured approximately the same as the MASH type ΔΣ modulator shown in FIG. 9. It should be noted that the ΔΣ modulator according to the fifth embodiment is different in that only the output of the integrator 44 of the ΔΣ modulator (42, 44, 46, 48) on the first stage is input to the ΔΣ modulator 54 on the second stage.

Also in the ΔΣ modulator according to the fifth embodiment, the overall accuracy is determined by the accuracy of the ΔΣ modulator 54 on the second stage. Therefore, the ΔΣ modulator (42, 44, 46, 48) on the first stage does not have to operate at a high speed; only the ΔΣ modulator 54 on the second stage is operated at a high speed. A ΔΣ modulator of a frequency modulation system is employed as the ΔΣ modulator 54 on the second stage, and a sampling frequency fs2 thereof is set high as in the fourth embodiment.

Though the above ΔΣ modulator according to the fifth embodiment includes the cascade type ΔΣ modulators on two stages, it is possible to constitute cascade type ΔΣ modulators on multiple stages. Moreover, the ΔΣ modulator on the first stage can be a high-order ΔΣ modulator, resulting in a high conversion accuracy.

Figure 13:
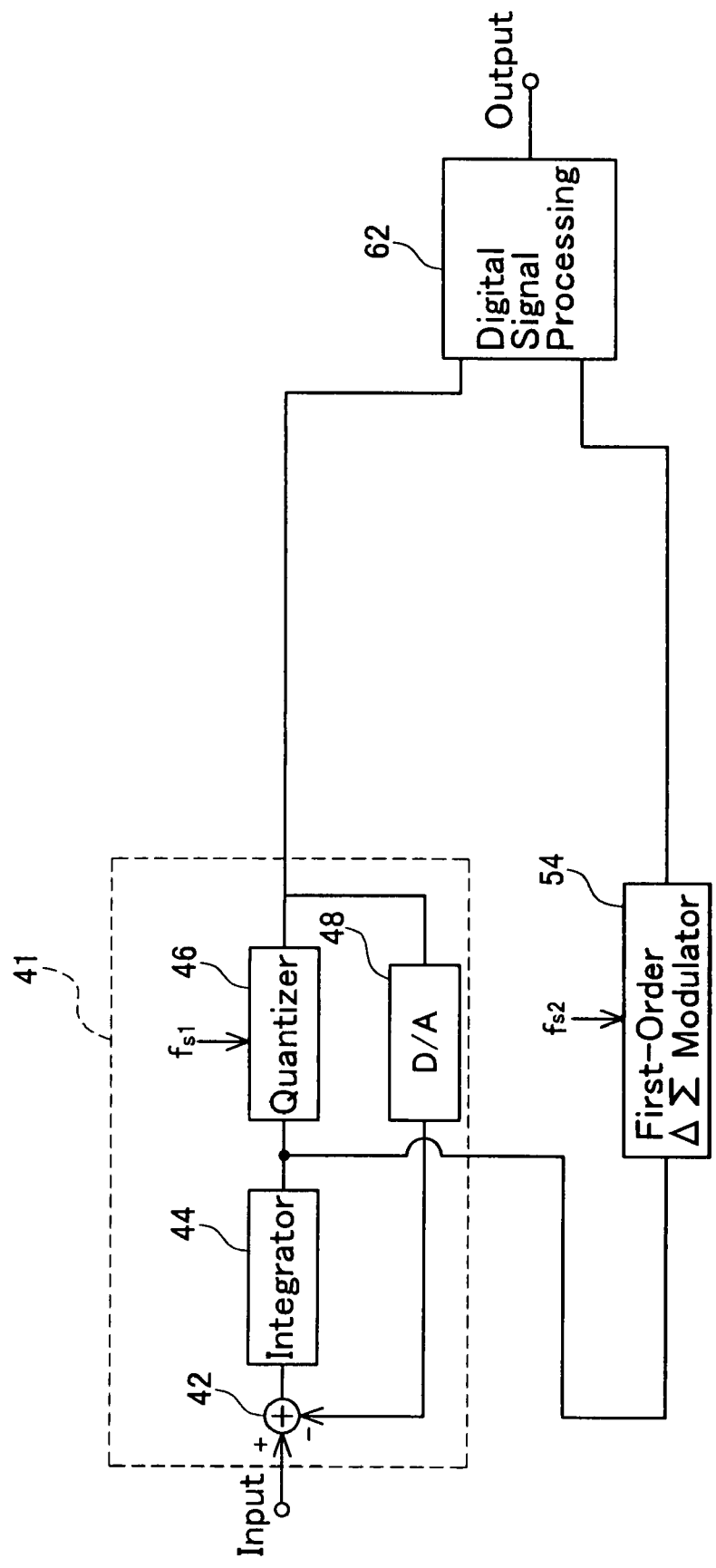
FIG. 13 is a block diagram showing a variation of the ΔΣ modulator shown in FIG. 12.

The MASH type ΔΣ modulator, the amplifier 52, the differential circuit (56, 58), and the amplifier 60, which are provided on the side of the ΔΣ modulator 54 on the second stage in the ΔΣ modulator shown in FIG. 12, may be removed, and the output of the ΔΣ modulator 54 on the second stage may be directly input to the digital signal processing circuit 62 (refer to FIG. 13). In this case, the digital signal processing circuit 62 carries out gain correction and differentiation of the output of the ΔΣ modulator 54, and then, carries out a process to convert a result thereof into a pulse density signal.

Figure 14:
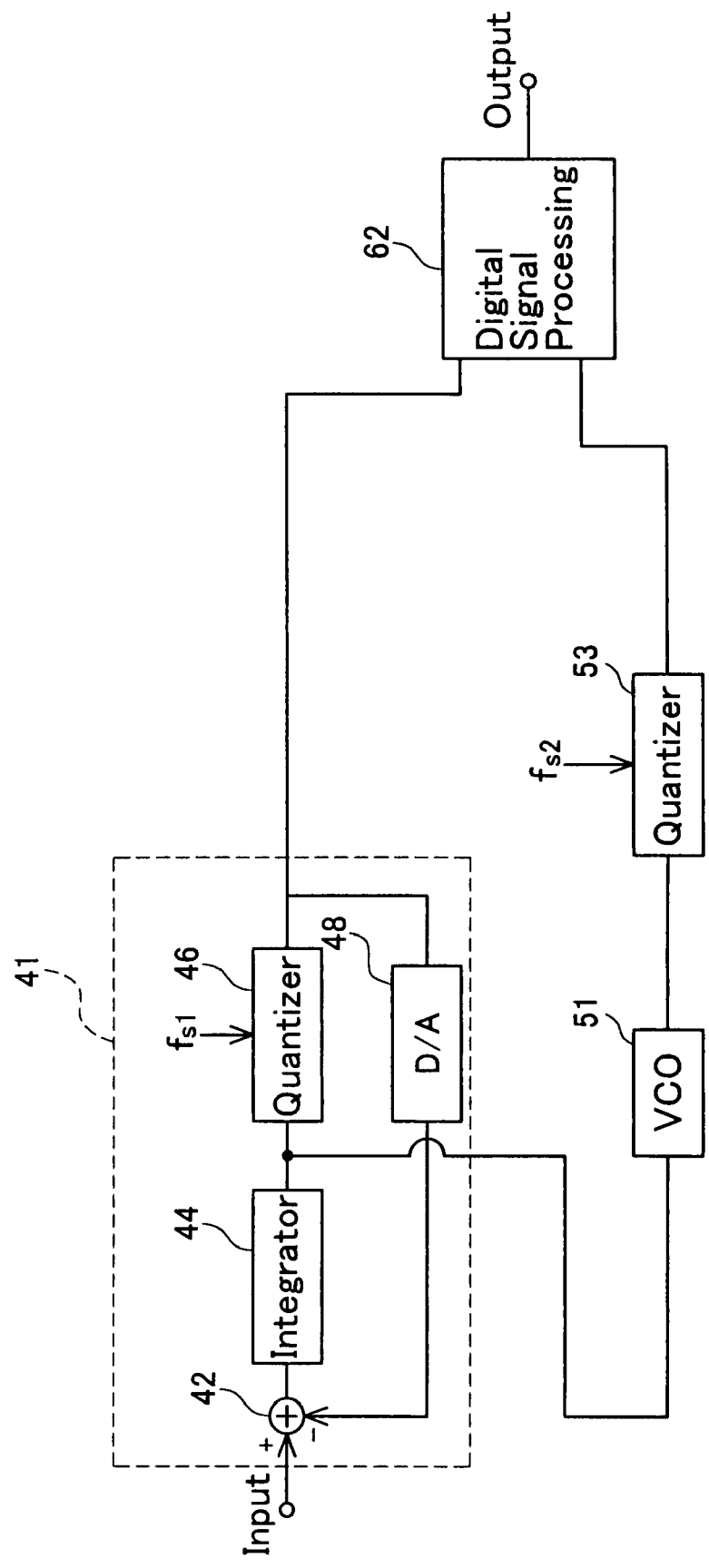
FIG. 14 is a block diagram showing another variation of the ΔΣ modulator shown in FIG. 12.

Further, the ΔΣ modulator 54 on the second stage in the ΔΣ modulator shown in FIG. 13 may be replaced by an oscillator 51 and a quantizer 53 (refer to FIG. 14). In this case, the digital signal processing circuit 62 applies a predetermined logical operation (operation carried out by the register 18 and the EX-OR circuit 20 in FIG. 1) to the output of the quantizer 53, carries out the gain correction, the differentiation, and then, the process of conversion into the pulse density signal. Also in the ΔΣ modulator shown in FIG. 13, the digital signal processing circuit 62 preferably corrects the signal output from the quantizer 53 in consideration of an input-output frequency characteristic of the oscillator 51.

Sixth Embodiment

Figure 15:
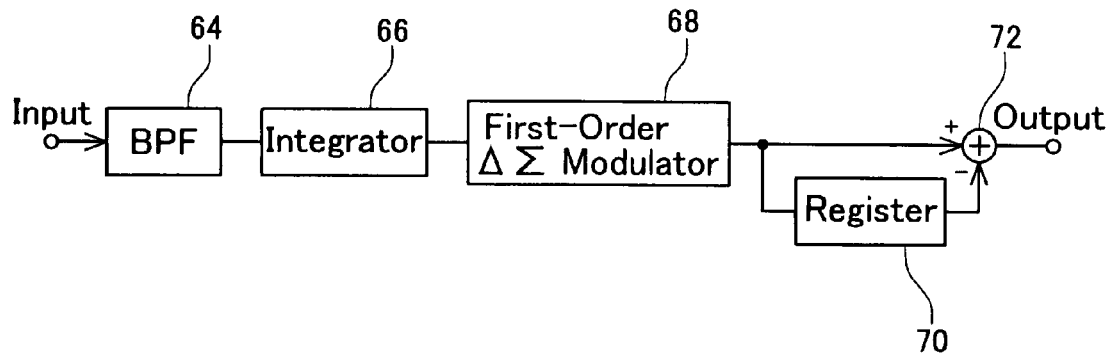
FIG. 15 is a block diagram showing an overall configuration of a ΔΣ modulator according to a sixth embodiment.

A description will now be given of a ΔΣ modulator according to a sixth embodiment of the present invention. FIG. 15 shows a configuration of the ΔΣ modulator according to the sixth embodiment. The ΔΣ modulator according to the sixth embodiment constitutes a second-order ΔΣ modulator by providing an integrator 66 on the input side of a first-order ΔΣ modulator 68 and providing a differential circuit (70, 72) on the output side of the ΔΣ modulator 68 without feeding back the output signal.

In this ΔΣ modulator, a band-pass filter 64 is provided on the input side of the integrator 66. As a result, the input analog signal is limited to a predetermined frequency band by the band-pass filter 64, and the analog signal in the narrow frequency band is input to the integrator 66. In other words, low frequency components, which will cause the saturation of the integrator 66, are removed from the analog signal, and the integrator 66 is restrained from saturating. This narrow-band ΔΣ modulator is efficient for handling a signal at an intermediate radio frequency.

Though either a ΔΣ modulator of a feedback system or a ΔΣ modulator of a frequency modulation system can be used as the ΔΣ modulator 68 according to the sixth embodiment, a ΔΣ modulator of a frequency modulation system is preferable. The employment of a ΔΣ modulator of a frequency modulation system no longer requires the feedback of the output signal, resulting in a high-speed operation.

Moreover, though the above embodiment describes an example of a second-order ΔΣ modulator, a high-order ΔΣ modulator can be constituted by properly designing the band-pass filter.

Seventh Embodiment

Figure 16:
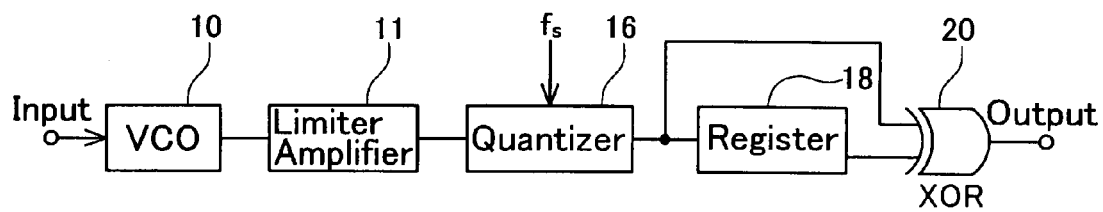
FIG. 16 is a block diagram showing an overall configuration of a ΔΣ modulator according to a seventh embodiment.

A description will now be given of a ΔΣ modulator according to a seventh embodiment of the present invention. FIG. 16 shows a configuration of the ΔΣ modulator according to the seventh embodiment.

The ΔΣ modulator according to the seventh embodiment is the ΔΣ modulator of frequency a modulation system described earlier, and a limiter amplifier 11 is provided between the voltage-controlled oscillator 10 and the quantizer 16. In this ΔΣ modulator, the frequency modulation signal output from the voltage-controlled oscillator 10 is input to the quantizer 16 via the limiter amplifier 11. The frequency modulation signal has a waveform similar to a square wave after passing the limiter amplifier 11. Therefore, the identification of the binary value in the quantizer 16 becomes easier, and a sensitivity requirement of quantizer 16 is lessened. As a result, the speed of the ΔΣ modulator can be increased.

Figure 17:
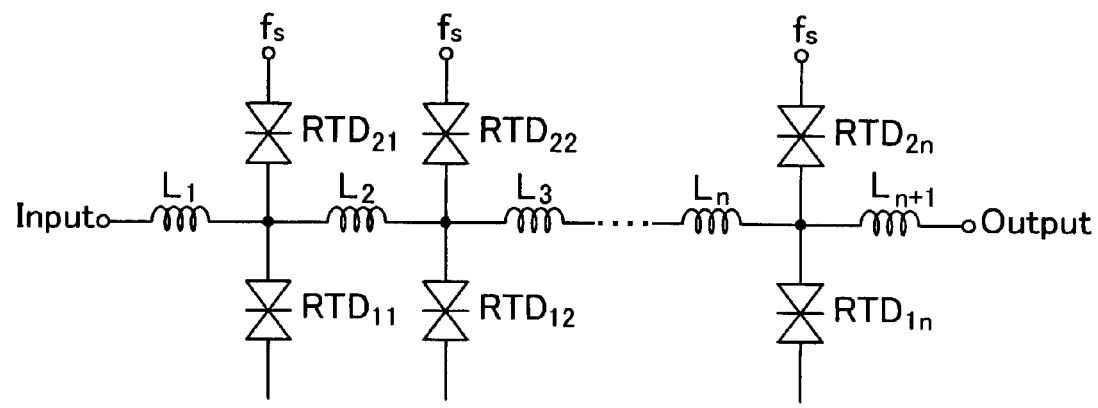
FIG. 17 is a circuit diagram showing a configuration example of a limiter amplifier shown in FIG. 16.

It should be noted that the limiter amplifier 11 can be configured by resonant tunnel diodes $RTD_{ij}$ and transmission lines Li as shown in FIG. 17. Since the resonant tunnel diode $RTD_{ij}$ can operate at high speed, the limiter amplifier 11 may be constituted by the resonant tunnel diodes $RTD_{ij}$ to operate the limiter amplifier 11 at high speed.

Eighth Embodiment

Figure 18:
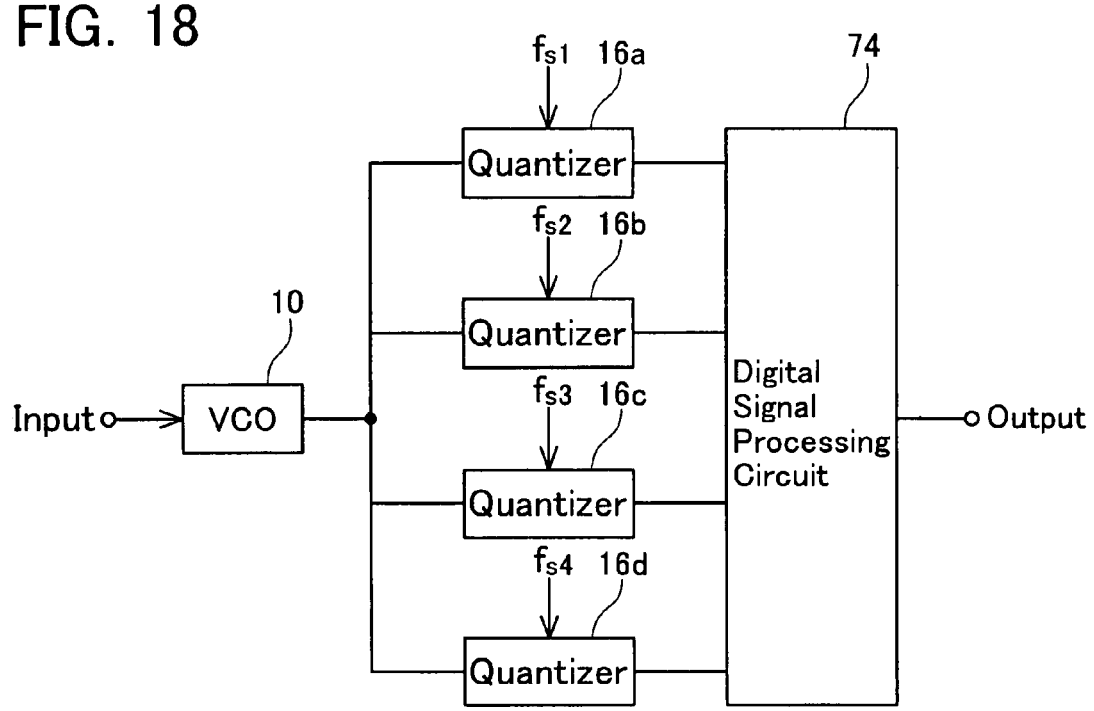
FIG. 18 is a block diagram showing an overall configuration of a ΔΣ modulator according to an eighth embodiment.

A description will now be given of a ΔΣ modulator according to an eighth embodiment of the present invention. FIG. 18 shows a configuration of the ΔΣ modulator according to the eighth embodiment.

In the ΔΣ modulator according to the eighth embodiment, four quantizer 16a, 16b, 16c, 16d are connected in parallel to the voltage-controlled oscillator 10, and outputs of the respective quantizers 16a, 16b, 16c, 16d are input to a digital signal processing circuit 74. Respective clock signals input to the quantizers 16a, 16b, 16c, 16d have the same frequency and phases successively displaced by $\pi/4$. As a result, the quantizers 16a, 16b, 16c, 16d output four quantized signals in different timings while one clock signal is being input. The digital signal processing circuit 74 converts the quantized signals output from the respective quantizers 16a, 16b, 16c, 16d into a pulse density signal, and outputs the pulse density signal. According to the present embodiment, the ΔΣ modulator operates at a speed four times as high as the actual clock frequency supplied, resulting in high accuracy.

Figure 19:
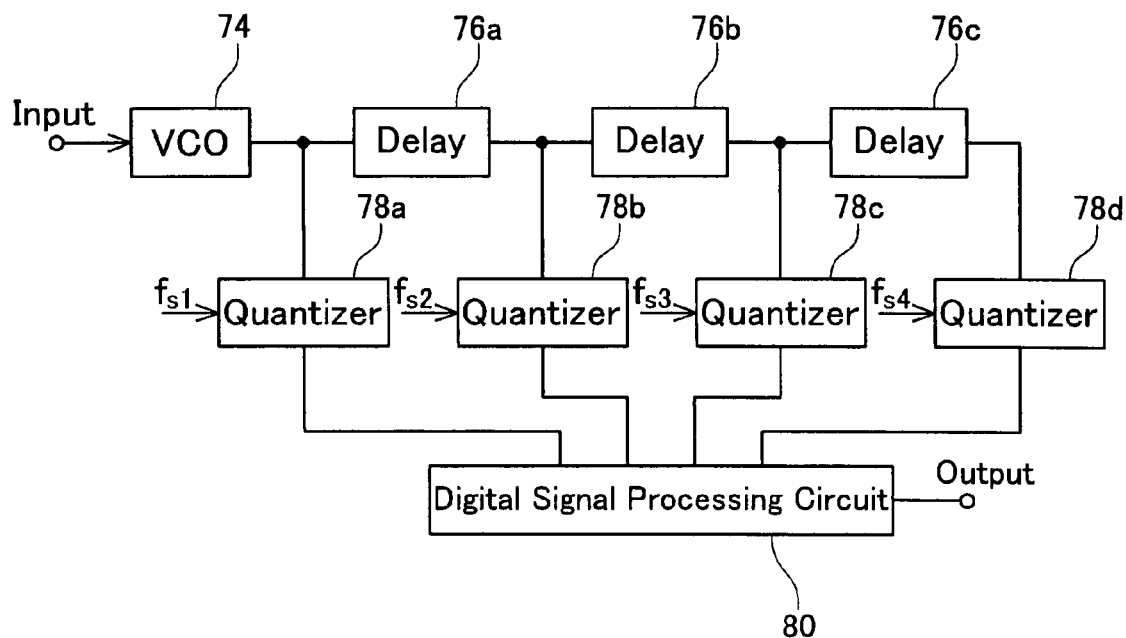
FIG. 19 is a block diagram showing a variation of the ΔΣ modulator shown in FIG. 18.

Though the phases of the clock signals input to the quantizers 16a, 16b, 16c, 16d are displaced in the embodiment shown in FIG. 18, the present invention is not limited to this example. For example, as shown in FIG. 19, the frequency modulation signals input to respective quantizers 78a, 78b, 78c, 78d may be delayed from each other by ¼ of the clock period by means of delay circuits 76a, 76b, 76c. Also with this configuration, the frequency modulation signal is sampled at a speed four times as high as the actual clock frequency supplied, resulting in high accuracy. Moreover, with the configuration shown in FIG. 19, it is possible to make the outputs of the quantizers 78a, 78b, 78c, 78d into the same phase, and the subsequent transfer of the data to the digital signal processing circuit 80 can thus be easily carried out.

EXAMPLE

The ΔΣ modulator configured as shown in FIG. 5 was actually designed as a circuit, and a description will now be given of a result of simulated characteristics thereof.

Figure 20:
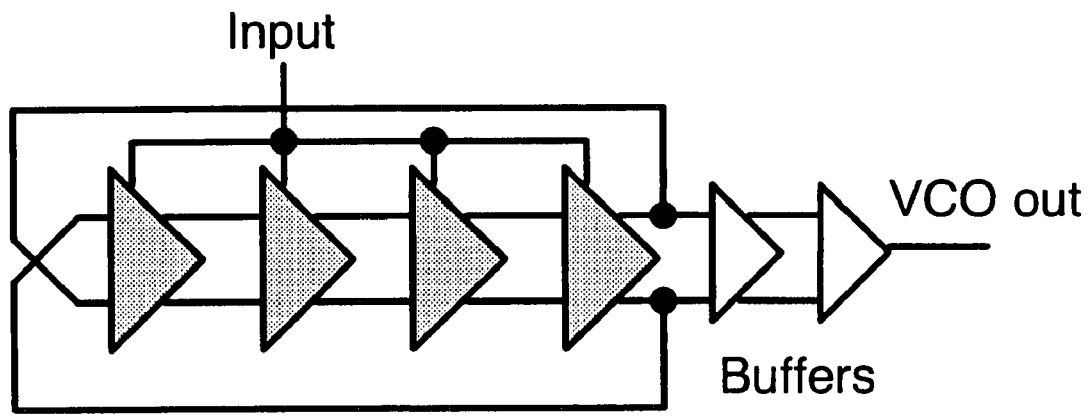
FIG. 20 is a circuit diagram showing an example of an oscillator of the ΔΣ modulator shown in FIG. 5.
Figure 21:
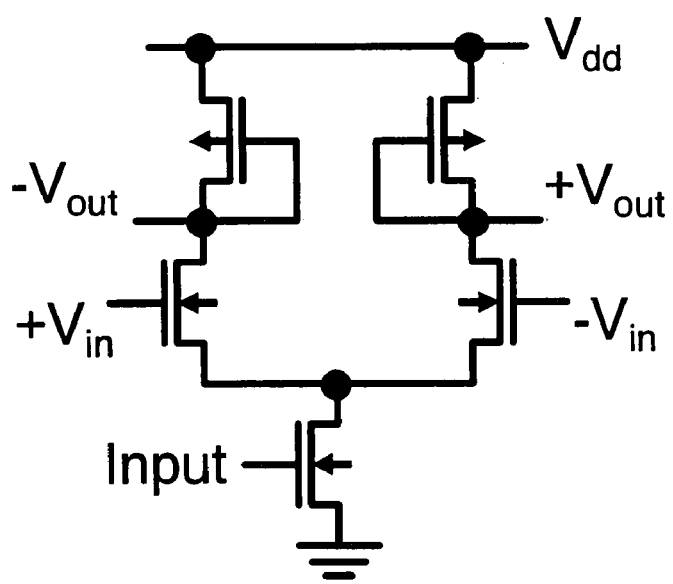
FIG. 21 is a circuit diagram showing a part of the circuit shown in FIG. 20 in detail.

The voltage-controlled oscillators 10a, 10b comprise a ring oscillator connecting multiple oscillators (FIG. 20). A circuit configuration of the respective oscillators is shown in FIG. 21. As shown in FIG. 21, the oscillator is constituted by multiple P-MOS FETs (FETs indicated by an arrow directed from the gate) and N-MOS FETs (FETs indicated by an arrow directed to the gate).

Figure 22:
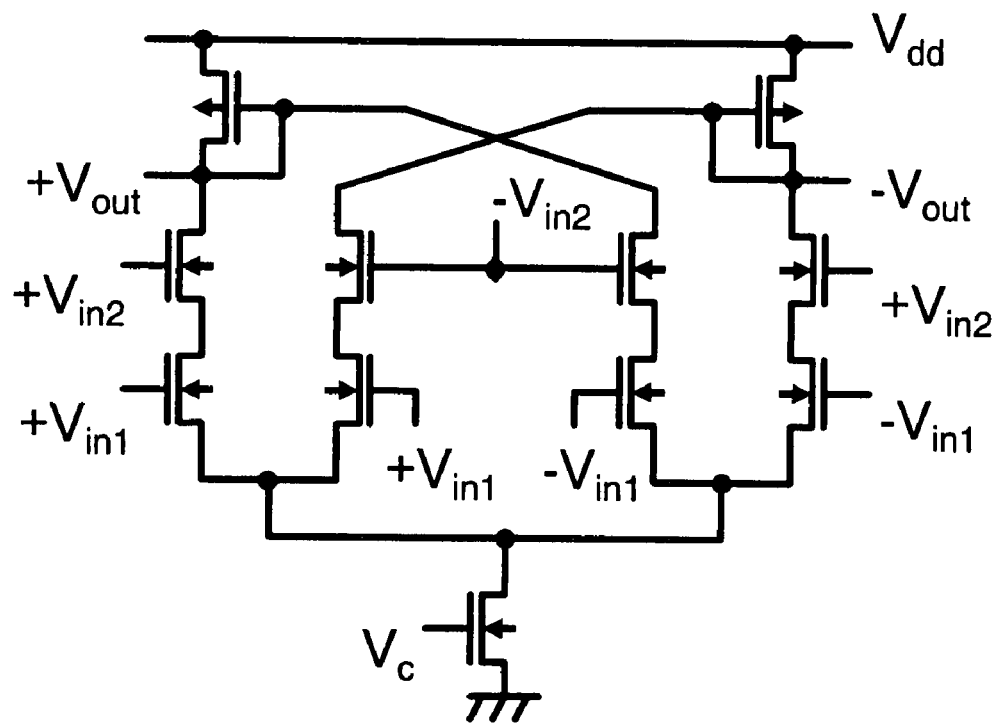
FIG. 22 is a circuit diagram showing an example of an adder of the ΔΣ modulator shown in FIG. 5.

A circuit configuration of the adder 12 is shown in FIG. 22. As shown in FIG. 22, the adder 12 is also constituted by multiple P-MOS FETs (FETs indicated by an arrow directed from the gate) and N-MOS FETs (FETs indicated by an arrow directed to the gate). Employment of the circuit configuration shown in FIG. 22 enables the extraction of the difference between the signals input from the voltage-controlled oscillators 10a, 10b in a wide frequency area.

Figure 23:
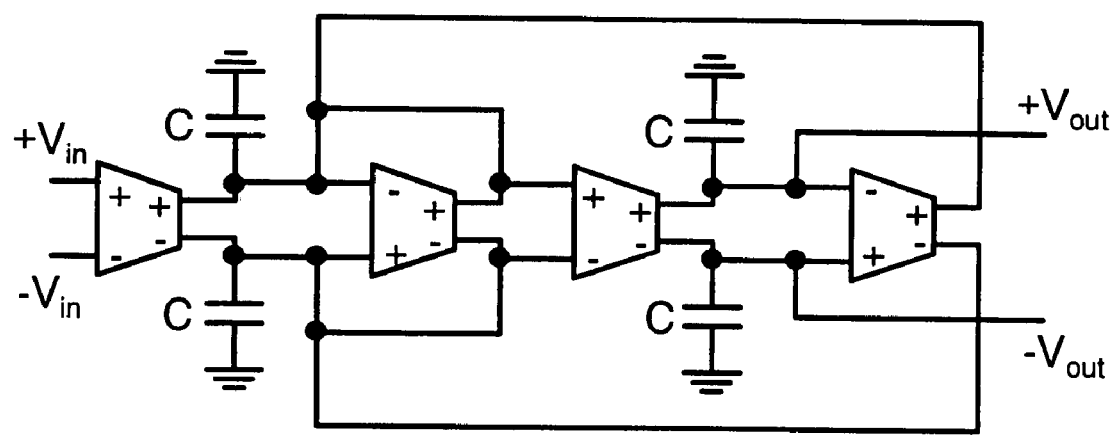
FIG. 23 is a circuit diagram showing an example of a low-pass filter of the ΔΣ modulator shown in FIG. 5.
Figure 24:
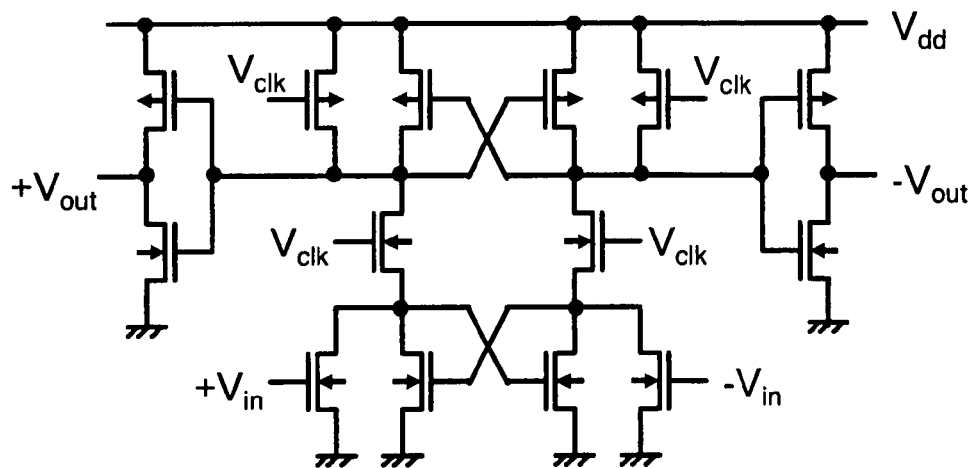
FIG. 24 is a circuit diagram showing an example of a quantizer of the ΔΣ modulator shown in FIG. 5.

Moreover a circuit configuration of the low-pass filter 14 is shown in FIG. 23, and a circuit configuration of the quantizer 16 is shown in FIG. 24.

Figure 25:
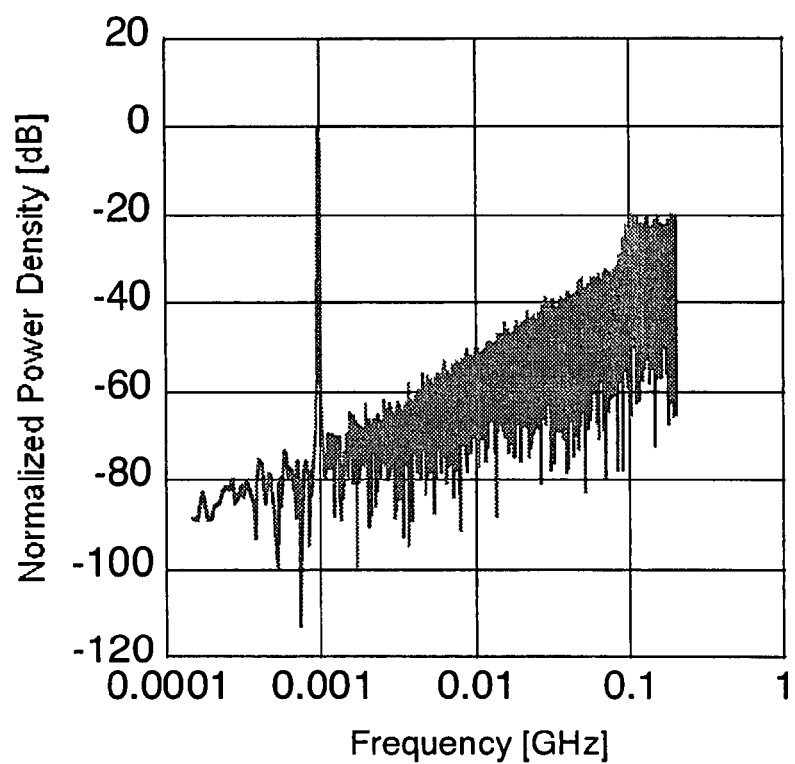
FIG. 25 shows an output power spectrum measured for the embodiment of the ΔΣ modulator shown in FIG. 5.

The ΔΣ modulator configured by the above circuits (FIGS. 20 to 24) was simulated while the frequency of the input signal was 1 MHz and the sampling frequency of the quantizer 16 was 400 MHz. A result of the simulation is shown in FIG. 25. In FIG. 25, the vertical axis indicates the intensity of the signal, and the horizontal axis indicates the frequency of the signal. As shown in FIG. 25, it was confirmed that an excellent noise shaping characteristic can be provided.

Figure 26:
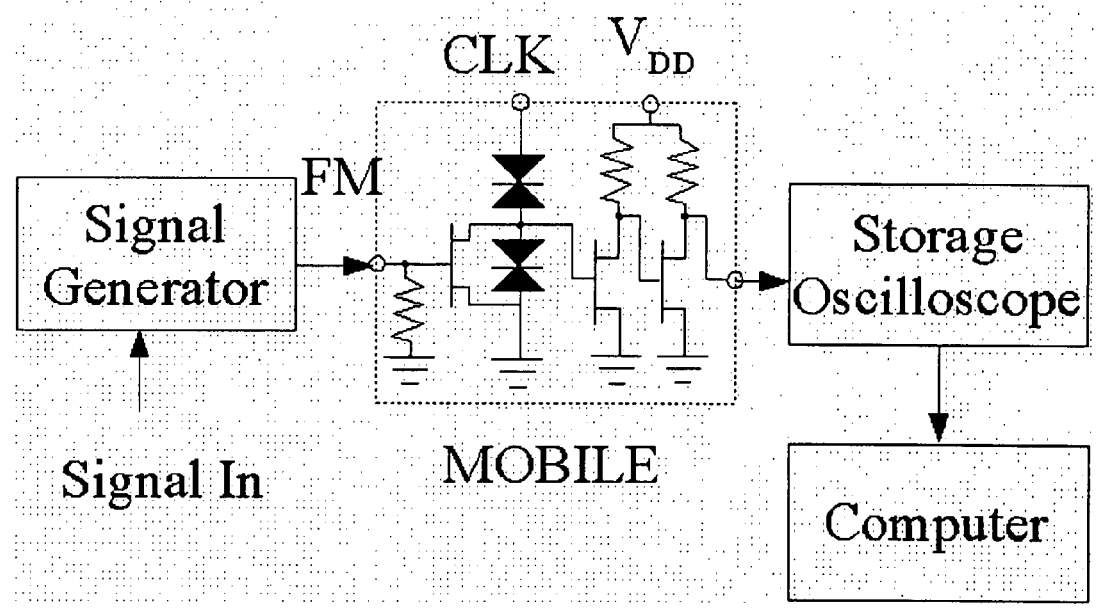
FIG. 26 shows a device configuration for an operation confirmation test of a quantizer using resonant tunnel diodes.
Figure 27:
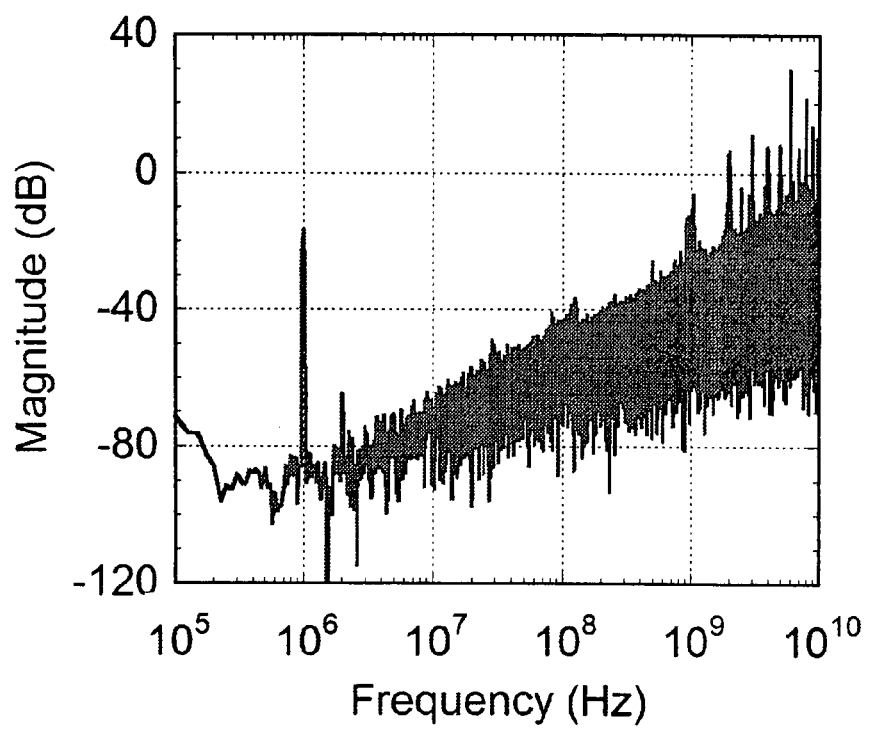
FIG. 27 shows an output waveform of the quantizer measured in the test shown in FIG. 26.
Figure 28:
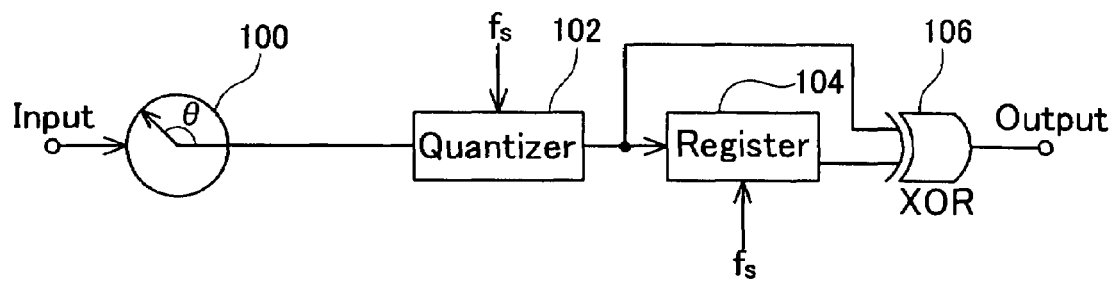
FIG. 28 is a block diagram showing a configuration of a conventional ΔΣ modulator of a frequency modulation system.
Figure 29:
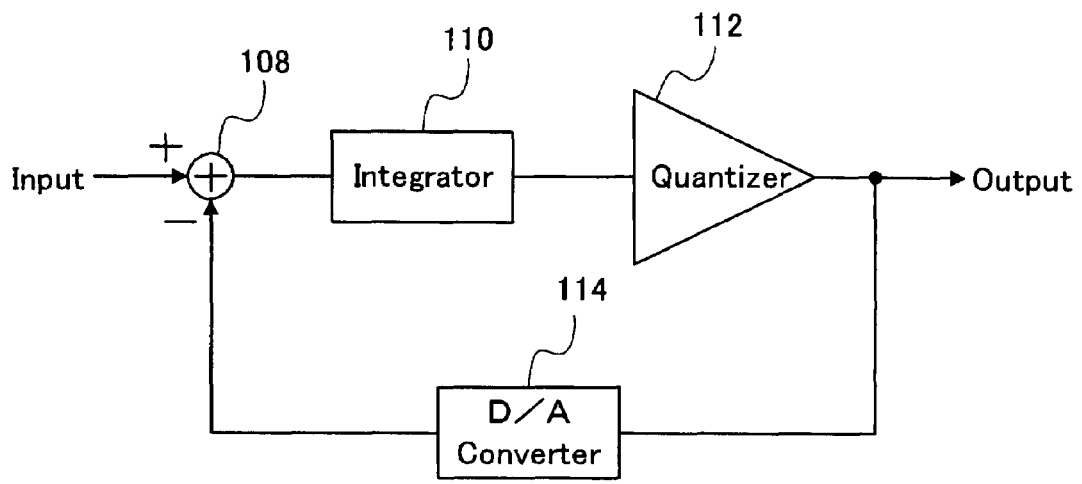
FIG. 29 is a block diagram showing a configuration of a conventional ΔΣ modulator of a feedback system.
Figure 30:
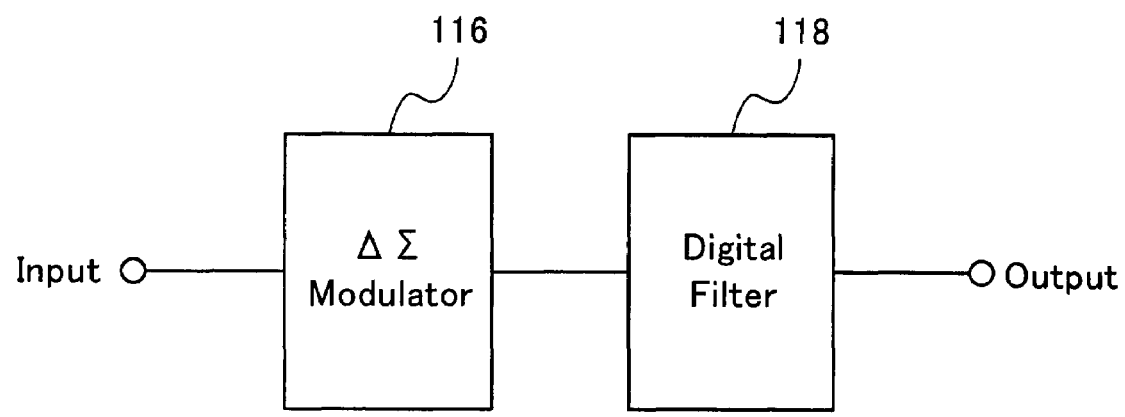
FIG. 30 is a block diagram showing a basic configuration of a ΔΣ analog-digital converter.

Moreover, the quantizer was actually produced using resonant tunnel diodes, and the operation of the produced quantizer was experimentally confirmed. FIG. 26 schematically shows a configuration of a device used for the experiment. An FM signal (frequency modulation signal) from a signal generator was input to the quantizer. The output of the quantizer was measured by a storage oscilloscope, and a measured result thereof was analyzed by a computer. FIG. 27 shows a measured output waveform of the quantizer. As measurement conditions, the frequency of the input signal is 1 MHz, and the sampling frequency is 20 GHz. As shown in FIG. 27, an excellent noise shaping characteristic was provided.

Several preferred embodiments of the present invention have been described above in detail, however, these embodiments are only examples and do not limit the scope of the claims. Various alternatives and modifications to the above specific examples are included in the technology described in the scope of the patent claims.

Furthermore, the technical elements disclosed in the present specification or figures have technical utility separately or in all types of conjunctions and are not limited to the conjunctions set forth in the claims at the time of filing. Moreover, the art disclosed in the present specification or the drawings achieve a plurality of objects simultaneously, and have technical utility by achieving one of those objects.

The invention claimed is:

1. A ΔΣ modulator comprising:
  an oscillator changing a frequency thereof according to an analog signal to be converted into a digital signal, wherein the analog signal is input into the oscillator, and the oscillator outputs a frequency modulation signal whose frequency changes according to the voltage of the analog signal;
  a reference signal source outputting a reference signal at a predetermined frequency;
  a mixer mixing the frequency modulation signal output from the oscillator and the reference signal output from the reference signal source;
  a low-pass filter passing a low frequency component of the frequency modulation signal output from the mixer;
  a quantizing unit quantizing the frequency modulation signal output from the low-pass filter; and
  an operation circuit applying a predetermined operation to a digital signal output from the quantizing unit,
  wherein a center oscillation frequency of the oscillator is set higher than a target center oscillation frequency of the frequency modulation signal output from the low-pass filter.

2. The ΔΣ modulator according to claim 1, wherein the quantizing unit comprises a plurality of quantizers connected in parallel, and the respective quantizers are driven by clock signals different in phase.

3. The ΔΣ modulator according to claim 1, wherein the quantizing unit comprises a plurality of quantizers, and frequency modulation signals different in phase are input to the respective quantizers.

4. The ΔΣ modulator according to claim 1, wherein the quantizing unit comprises a first negative differential resistance element which bears an N-type negative differential resistance, and a second negative differential resistance element which is serially connected to the first negative differential resistance element, and bears an N-type negative differential resistance, and an oscillating voltage is impressed between terminals of the two negative differential resistance elements.

5. The ΔΣ modulator according to claim 4, wherein the quantizing unit further comprises a transistor, and wherein the analog input signal is input to an input terminal of the transistor, an output terminal thereof is connected to a connection point between the first negative differential resistance element and the second negative differential resistance element.

6. The ΔΣ modulator according to claim 4, wherein the input signal is input to a connection point between the first negative differential resistance element and the second negative differential resistance element via an impedance element, an oscillating voltage including a predetermined DC bias voltage is impressed on either an outer terminal of the first negative differential resistance element or an outer terminal of the second negative differential resistance element, and an oscillating voltage having opposite polarity along with the predetermined DC bias voltage is impressed on the other of the two outer terminals.

7. The ΔΣ modulator according to claim 1, wherein a limiter amplifier is provided on an input side of said quantizing unit.

8. The ΔΣ modulator according to claim 7, wherein the limiter amplifier comprises an N type negative differential resistance element and an impedance element.

9. A ΔΣ analog-digital converter comprising the ΔΣ modulator according to claim 1.

10. A ΔΣ modulator comprising:
a first oscillator changing a frequency thereof according to an input signal;
a second oscillator changing a frequency thereof according to the input signal;
a mixer mixing the signals from the two oscillators;
a low-pass filter passing a low frequency component of a signal output from the mixer;
a quantizing unit quantizing a frequency modulation signal output from the low-pass filter; and
an operation circuit applying a predetermined operation to a digital signal output from the quantizing unit,
wherein either the first oscillator or the second oscillator has a positive frequency dependency to the input signal, and the other has a negative frequency dependency to the input signal, and center oscillation frequencies of the two oscillators are set higher than a target center oscillation frequency of the frequency modulation signal.

11. The ΔΣ modulator according to claim 10, wherein the first oscillator and the second oscillator are voltage-controlled oscillators, an analog signal for control which is input to one of the voltage-controlled oscillators is a complementary signal of an analog signal for control which is input to the other one of the voltage-controlled oscillators.

12. The ΔΣ modulator according to claim 10, wherein the quantizing unit comprises a plurality of quantizers connected in parallel, and the respective quantizers are driven by clock signals different in phase.

13. The ΔΣ modulator according to claim 10, wherein the quantizing unit comprises a plurality of quantizers, and frequency modulation signals different in phase are input to the respective quantizers.

14. The ΔΣ modulator according to claim 10, wherein the quantizing unit comprises a first negative differential resistance element which bears an N-type negative differential resistance, and a second negative differential resistance element which is serially connected to the first negative differential resistance element, and bears an N-type negative differential resistance, and an oscillating voltage is impressed between terminals of the two negative differential resistance elements.

15. The ΔΣ modulator according to claim 14, wherein the quantizing unit further comprises a transistor, and wherein the analog input signal is input to an input terminal of the transistor, an output terminal thereof is connected to a connection point between the first negative differential resistance element and the second negative differential resistance element.

16. The ΔΣ modulator according to claim 14, wherein the input signal is input to a connection point between the first negative differential resistance element and the second negative differential resistance element via an impedance element, an oscillating voltage including a predetermined DC bias voltage is impressed on either an outer terminal of the first negative differential resistance element or an outer terminal of the second negative differential resistance element, and an oscillating voltage having opposite polarity along with the predetermined DC bias voltage is impressed on the other of the two outer terminals.

17. The ΔΣ modulator according to claim 10, wherein a limiter amplifier is provided on an input side of said quantizing unit.

18. The ΔΣ modulator according to claim 17, wherein the limiter amplifier comprises an N type negative differential resistance element and an impedance element.

19. A ΔΣ modulator comprising:
an integrator integrating an analog input signal to be converted into a digital signal;
an oscillator changing a frequency thereof according to an output analog signal from the integrator, wherein the output analog signal from the integrator is input to the oscillator, and the oscillation outputs a frequency modulation signal whose frequency changes according to the voltage of the analog signal;
a quantizing unit quantizing the frequency modulation signal output from the oscillator;
an operation circuit applying a first predetermined operation to a digital signal output from the quantizing unit;
a detector detecting that the output signal from the integrator reaches a predetermined value;
a switch resetting the integrator based on a detection signal from the detector; and
a processor applying a second predetermined operation to a digital signal output from the operation circuit based on the detection signal output from the detector.

20. The ΔΣ modulator according to claim 19, wherein the quantizing unit comprises a plurality of quantizers connected in parallel, and the respective quantizers are driven by clock signals different in phase.

21. The ΔΣ modulator according to claim 19, wherein the quantizing unit comprises a plurality of quantizers, and frequency modulation signals different in phase are input to the respective quantizers.

22. The ΔΣ modulator according to claim 19, wherein the quantizing unit comprises a first negative differential resistance element which bears an N-type negative differential resistance, and a second negative differential resistance element which is serially connected to the first negative differential resistance element, the second negative differential resistance element bears an N-type negative differential resistance, and an oscillating voltage is impressed between terminals of the two negative differential resistance elements.

23. The ΔΣ modulator according to claim 22, wherein the quantizing unit further comprises a transistor, and wherein the analog input signal is input to an input terminal of the transistor, an output terminal thereof is connected to a connection point between the first negative differential resistance element and the second negative differential resistance element.

24. The ΔΣ modulator according to claim 22, wherein the input signal is input to a connection point between the first negative differential resistance element and the second negative differential resistance element via an impedance element, an oscillating voltage including a predetermined DC bias voltage is impressed on either an outer terminal of the first negative differential resistance element or an outer terminal of the second negative differential resistance element, and an oscillating voltage having opposite polarity along with the predetermined DC bias voltage is impressed on the other of the two outer terminals.

25. The ΔΣ modulator according to claim 19, wherein a limiter amplifier is provided on an input side of the quantizing unit.

26. The ΔΣ modulator according to claim 25, wherein the limiter amplifier comprises an N type negative differential resistance element and an impedance element.

27. A ΔΣ modulator comprising:
an integrator integrating an analog input signal to be converted into a digital signal;

a quantizer quantizing an output signal from the integrator;

an operation circuit applying a first predetermined operation to a digital signal output from the quantizer;

a detector detecting that the output signal from the integrator reaches a predetermined value;

a switch resetting the integrator based on a detection signal from the detector; and a processor applying a second predetermined operation to a digital signal output from the operation circuit based on the detection signal output from the detector.

28. A $\Delta\Sigma$ modulation device comprising:

a first $\Delta\Sigma$ modulator comprising an integrator integrating an analog input signal, a quantizer quantizing an output signal from the integrator, and a first adder inverting the polarity of an output signal from the quantizer and adding the inverted output signal to the analog input signal;

a second adder inverting the polarity of either the output signal from the quantizer of the first $\Delta\Sigma$ modulator or the output signal from the integrator of the first $\Delta\Sigma$ modulator, and adding the inverted signal to the other of the output signal from the quantizer of the first $\Delta\Sigma$ modulator and the output signal from the integrator of the first $\Delta\Sigma$ modulator;

a second $\Delta\Sigma$ modulator modulating a signal output from the second adder; and an operation circuit applying a predetermined operation to a digital signal output from the second $\Delta\Sigma$ modulator and the digital signal output from the quantizer of the first $\Delta\Sigma$ modulator, wherein a sampling frequency of the second $\Delta\Sigma$ modulator is higher than a sampling frequency of the first $\Delta\Sigma$ modulator, and the operation circuit corrects the gain of the digital signal output from the second $\Delta\Sigma$ modulator, and then carries out the predetermined operation.

29. A $\Delta\Sigma$ modulation device comprising:

a first $\Delta\Sigma$ modulator comprising an integrator integrating an analog input signal, a first quantizer quantizing an output signal from the integrator, and a first adder inverting the polarity of an output signal from the first quantizer and adding the inverted output signal to the analog input signal;

a second adder for inverting the polarity of either the output signal from the first quantizer of the first $\Delta\Sigma$ modulator or the output signal from the integrator of the first $\Delta\Sigma$ modulator, and adding the inverted signal to the other one of the output signal from the first quantizer of the first $\Delta\Sigma$ modulator and the output signal from the integrator of the first $\Delta\Sigma$ modulator;

an oscillator changing a frequency thereof according to a signal from the second adder;

a second quantizer quantizing an output signal from the oscillator; and an operation circuit applying a predetermined operation to a digital signal output from the second quantizer and the digital signal output from the first quantizer of the first $\Delta\Sigma$ modulator, wherein a sampling frequency of the second quantizer is higher than a sampling frequency of the first $\Delta\Sigma$ modulator, and the operation circuit corrects the digital signal output from the second quantizer by means of an input-output frequency characteristic of the oscillator, and then carries out the predetermined operation.

30. A $\Delta\Sigma$ modulation device comprising:

a first $\Delta\Sigma$ modulator comprising an integrator integrating an analog input signal, a quantizer quantizing an output signal from the integrating means, and an adder inverting the polarity of an output signal from the quantizer and adding the inverted output signal, to the analog input signal;

a second $\Delta\Sigma$ modulator modulating the signal output from the integrator of the first $\Delta\Sigma$ modulator; and an operation circuit applying a predetermined operation to a digital signal output from the second $\Delta\Sigma$ modulator and the digital signal output from the quantizer of the first $\Delta\Sigma$ modulator, wherein a sampling frequency of the second $\Delta\Sigma$ modulator is higher than a sampling frequency of the first $\Delta\Sigma$ modulator, and the operation circuit corrects the gain of the digital signal output from the second $\Delta\Sigma$ modulator, and then carries out the predetermined operation.

31. A $\Delta\Sigma$ modulation device comprising:

a first $\Delta\Sigma$ modulator comprising an integrator integrating an analog input signal, a first quantizer quantizing an output signal from the integrator, and an adder inverting the polarity of an output signal from the first quantizer and adding the inverted output signal to the analog input signal;

an oscillator changing a frequency thereof according to a signal output from the integrator of the first $\Delta\Sigma$ modulator;

a second quantizer quantizing an output signal from the oscillator; and an operation circuit applying a predetermined operation to a digital signal output from the second quantizer and the digital signal output from the first quantizer of the first $\Delta\Sigma$ modulator, wherein a sampling frequency of the second quantizer is higher than a sampling frequency of the first $\Delta\Sigma$ modulator, and the operation circuit corrects the digital signal output from the second quantizer by means of an input-output frequency characteristic of the oscillator, and then carries out the predetermined operation.

32. The $\Delta\Sigma$ modulation device according to claim 31, wherein the operation circuit further corrects the gain of the digital signal output from the second quantizer, and then carries out the predetermined operation.

33. A $\Delta\Sigma$ modulation device comprising:

a first oscillator changing a frequency thereof according to an input signal;

a second oscillator changing a frequency thereof according to the input signal;

a first quantizer quantizing a frequency modulation signal output from the first oscillator;

a second quantizer quantizing a frequency modulation signal output from the second oscillator; and a processor processing digital signals output respectively from the first and second quantizer, wherein either the first oscillator or the second oscillator has a positive frequency dependency to the input signal, and the other has a negative frequency dependency to the input signal.

34. The $\Delta\Sigma$ modulation device according to claim 33, wherein center oscillation frequencies of the two oscillator are set higher than a target center oscillation frequency of the frequency modulation signal.

* * * * *